(12) United States Patent
Sonoda et al.

(10) Patent No.: US 8,828,856 B2
(45) Date of Patent: Sep. 9, 2014

(54) SUBSTRATE ON WHICH FILM IS FORMED, AND ORGANIC EL DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 13/980,873

(22) PCT Filed: Jan. 13, 2012

(86) PCT No.: PCT/JP2012/050576
§ 371 (c)(1),
(2), (4) Date: Jul. 19, 2013

(87) PCT Pub. No.: WO2012/099010
PCT Pub. Date: Jul. 26, 2012

(65) Prior Publication Data
US 2013/0292666 A1    Nov. 7, 2013

(30) Foreign Application Priority Data

Jan. 20, 2011 (JP) .................. 2011-010177

(51) Int. Cl.
*H01L 21/22* (2006.01)
*C23C 16/00* (2006.01)
*H01L 27/32* (2006.01)
*C23C 14/04* (2006.01)
*C23C 14/56* (2006.01)
*H01L 51/56* (2006.01)

(52) U.S. Cl.
CPC ......... *H01L 27/3295* (2013.01); *H01L 27/3283* (2013.01); *C23C 14/042* (2013.01); *C23C 14/56* (2013.01); *H01L 27/3211* (2013.01);
*H01L 27/3276* (2013.01); *H01L 51/56* (2013.01); *H01L 2227/323* (2013.01)
USPC .......... 438/555; 427/248.1; 118/720

(58) Field of Classification Search
CPC ............. H01L 27/3238; H01L 21/67359; H01L 27/3211; H01L 27/323
USPC .......... 438/555; 427/248.1; 118/720
See application file for complete search history.

(56) References Cited

U.S. PATENT DOCUMENTS 6,294,892 B1    9/2001    Utsugi et al.
6,366,025 B1    4/2002    Yamada
8,313,806 B2*  11/2012    Matsuura ................ 427/255.28

FOREIGN PATENT DOCUMENTS

JP    10-102237 A    4/1998
JP    2000-188179 A  7/2000

(Continued)

OTHER PUBLICATIONS

International Search Report received for PCT Patent Application No. PCT/JP2012/050576, mailed on Feb. 7, 2012, 4 pages. (2 pages of English Translation and 2 pages of Official copy).

*Primary Examiner* — William D Coleman
(74) *Attorney, Agent, or Firm* — Morrison & Foerster LLP

(57) ABSTRACT

Provided is a TFT substrate (10) on which vapor-deposited sections are to be formed by use of a vapor deposition device (50) which includes a vapor deposition source (85) having injection holes (86); and a vapor deposition mask (81) having opening (82) through which vapor deposition particles are deposited to form the vapor-deposited sections. The TFT substrate (10) includes pixels two-dimensionally arranged in a pixel region (AG); and wires (14) electrically connected to the respective pixels. The vapor-deposited sections (Q) are formed with gaps (X) therebetween, and the wires (14) having respective terminals that are disposed in the gaps (X).

4 Claims, 16 Drawing Sheets

(56) References Cited

FOREIGN PATENT DOCUMENTS

| | | |
|---|---|---|
| JP | 2003-223988 A | 8/2003 |
| JP | 2004-349101 A | 12/2004 |
| JP | 2005-166691 A | 6/2005 |
| JP | 2009-019243 | 1/2009 |
| JP | 2009-259510 A | 11/2009 |

* cited by examiner

SUBSTRATE SCANNING DIRECTION

F I G. 6
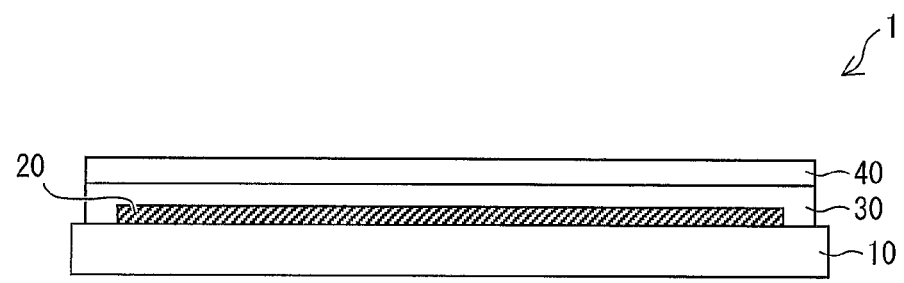

F I G. 8
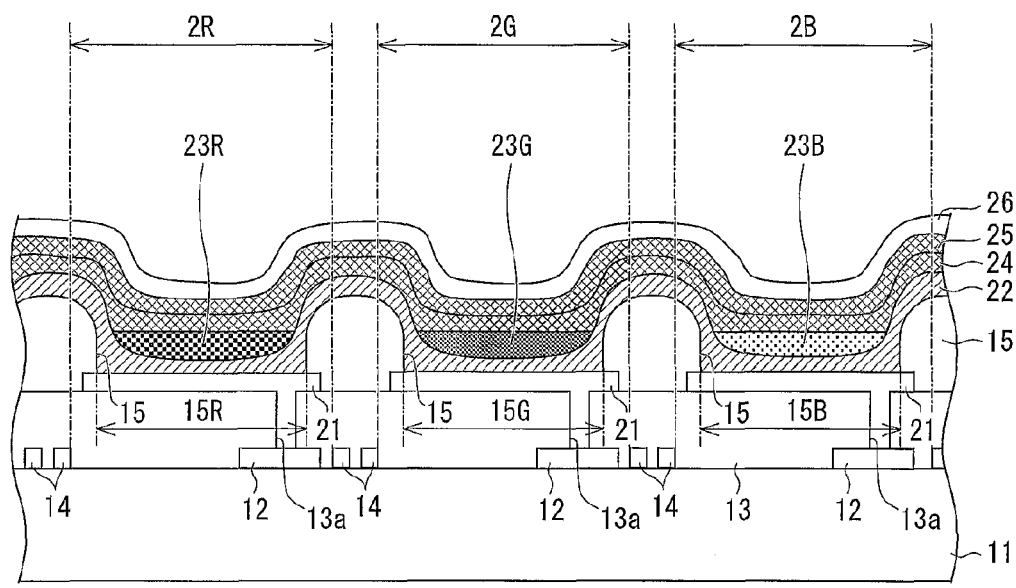

F I G. 1 9
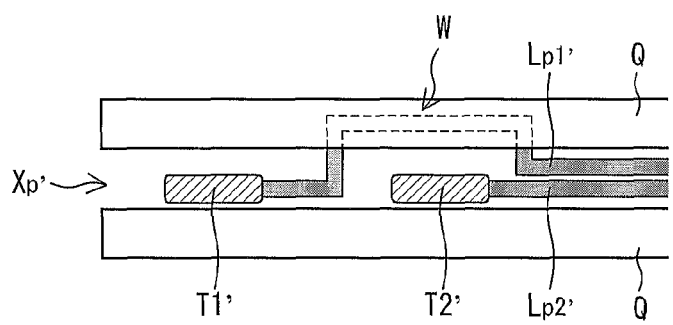
F I G. 2 0    Prior Art
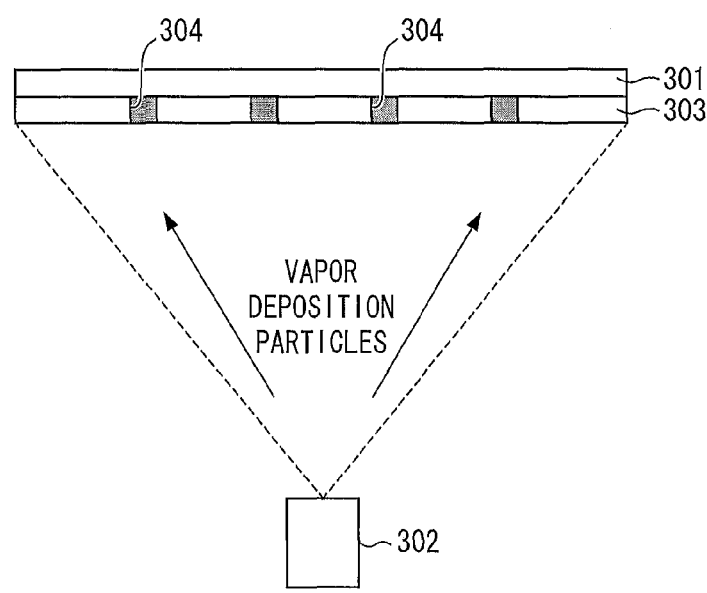

SUBSTRATE ON WHICH FILM IS FORMED, AND ORGANIC EL DISPLAY DEVICE

CROSS REFERENCE TO RELATED APPLICATIONS

This is a U.S. National Phase patent application of PCT/JP2012/050576, filed Jan. 13, 2012, which claims priority to Japanese patent application no. 2011-010177, filed Jan. 20, 2011, each of which is hereby incorporated by reference in the present disclosure in its entirety.

TECHNICAL FIELD

The present invention relates to a technique of vapor deposition for forming a film of a predetermined pattern on a film formation substrate.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes organic EL elements of red (R), green (G), and blue (B) as sub-pixels aligned on a substrate. The full-color organic EL display device carries out an image display by, with use of TFTs, selectively causing the organic EL elements to each emit light with a desired luminance.

Such an organic EL display device is produced through a process that forms, for each organic EL element serving as a light-emitting element, a pattern of a luminescent layer made of an organic luminescent material which emits light of at least the above three colors (see, for example, Patent Literatures 1 and 2).

Such formation of a luminescent layer pattern is performed by a method such as a vacuum vapor deposition method that uses a vapor deposition mask referred to as a shadow mask.

The production of, for example, a low-molecular organic EL display (OLED) has conventionally used a vapor deposition method involving a shadow mask, the vapor deposition method forming organic films (organic layers) by selective application.

The vacuum vapor deposition method involving a shadow mask uses a shadow mask (full-cover contact type shadow mask) that is so sized as to allow vapor deposition to be performed throughout the entire vapor deposition region of a substrate. The shadow mask is typically equivalent in size to the substrate.

FIG. 20 is a cross-sectional view schematically illustrating a configuration of a conventional vapor deposition device involving a shadow mask.

The vacuum vapor deposition method involving a shadow mask, as illustrated in FIG. 20, forms a pattern by (i) placing a substrate 301 and a vapor deposition source 302 at such positions that the substrate 301 and the vapor deposition source 302 face each other, (ii) forming, in a shadow mask 303, openings 304 corresponding to a pattern of a portion of a target vapor deposition region so that no vapor deposition particles are adhered to a region other than the vapor deposition region, and (iii) depositing vapor deposition particles onto the substrate 301 through the openings 304.

The substrate 301 is placed in a vacuum chamber (not shown). The vapor deposition source 302 is fixed below the substrate 301. The shadow mask 303 is either fixed in close contact with the substrate 301 or moved relative to the substrate 301 while the substrate 301 and the vapor deposition source 302 are fixed to an inner wall of the vacuum chamber.

Patent Literature 1, for example, discloses a method that involves a load-lock vapor deposition source, the method (i) aligning a mask and a substrate with each other, next (ii) performing vacuum vapor deposition of a first luminescent material from directly below the substrate to form an arrangement of first light-emitting sections each substantially identical in shape to an opening of the mask, then (iii) shifting the mask, and (iv) performing vacuum vapor deposition of a second luminescent material from directly below the substrate to form an arrangement of second light-emitting sections each substantially identical in shape to the opening of the mask.

Patent Literature 2, for example, discloses a method for forming an electrode pattern, the method (i) aligning, in a mask equivalent in size to a substrate, short-diameter holes or long and narrow slit pores in a direction which intersects a direction in which the mask is shifted and (ii) performing vapor deposition of an electrode material while the mask is shifted in a direction in which the short-diameter holes or slit pores are aligned.

In the vacuum vapor deposition method involving a shadow mask as described above, the shadow mask is fixed (for example, welded) to a mask frame under tension for prevention of, for example, bending and distortion.

The vacuum vapor deposition method involving a shadow mask forms a luminescent layer pattern or an electrode pattern by (i) closely contacting a shadow mask such as the above with a substrate and (ii) causing vapor deposition particles from a vapor deposition source to be deposited (adhered) onto a desired position of the substrate through an opening of the shadow mask.

CITATION LIST

Patent Literature 1

Japanese Patent Application Publication, Tokukai, No. 2000-188179 A (Publication Date: Jul. 4, 2000) (corresponding U.S. Pat. No. 6,294,892 (Publication Date: Sep. 25, 2001))

Patent Literature 2

Japanese Patent Application Publication, Tokukaihei, No. 10-102237 A (Publication Date: Apr. 21, 1998)

SUMMARY OF INVENTION

Technical Problem

Unfortunately, a larger substrate size requires the shadow mask 303 to be larger in size as well.

Such a larger size results in a gap opening between the substrate 301 and the shadow mask 303 due to, for example, self-weight bending and elongation of the shadow mask 303. This makes it impossible to form a pattern with high positional accuracy, and thus causes, for example, misplacement in vapor deposition and color mixture, thereby making it difficult to achieve high resolution.

Further, a larger substrate size requires the shadow mask 303 and a mask frame that holds it to be both extremely large and heavy. This in turn requires a device that uses the shadow mask 303 to be extremely large and complex, which not only makes it difficult to design such a device, but also causes a safety problem in handling the shadow mask during a production step or a step such as replacing the shadow mask.

It is, in consequence, extremely difficult to form a pattern on a large-sized substrate with use of a large-sized shadow mask.

A process of producing an organic EL display device requires a substrate size of approximately 1 m per side in order to use an existing mass production process of the vapor deposition method involving a full-cover contact type shadow mask. It is difficult to use the vapor deposition method for a large-sized substrate having a substrate size larger than approximately 1 m per side. This indicates that there currently exists no established organic layer selective application technique that is usable for a large-sized substrate. It is thus impossible to mass-produce a large-sized organic EL display device of a 60-inch class or a larger size.

A larger substrate size normally allows a larger number of panels to be formed from a single substrate, and thus reduces the unit cost of a panel. This means that a larger sized substrate allows an organic EL display device to be produced at a lower cost. Conventionally, however, the above constraint in substrate size has prevented production of a low-cost organic EL display device.

One solution to these problems is to reduce an area of the shadow mask 303 by employing an arrangement in which vapor deposition is carried out by moving at least one of the substrate and the shadow mask 303 relative to the other in a direction while securing a predetermined gap between the substrate and the shadow mask 303.

However, such an arrangement causes the following problem.

Specifically, the substrate generally has a region on which vapor deposition particles need not to be vapor-deposited or a region on which vapor deposition particles should not be vapor-deposited (these regions are hereinafter referred to as "vapor deposition unnecessary region"). The vapor deposition unnecessary region is, for example, a connection section (terminal section) in which terminals for connection with an external circuit are gathered. No vapor deposition is carried out on the terminals, and thus the terminals are exposed.

The arrangement, in which the substrate is moved relative to the shadow mask so that vapor deposition is carried out throughout a region from one end to the other end in a direction in which the substrate is moved, cannot establish good electrical connection between the connection section (terminal section) and the external circuit in a case where (i) a region on which the vapor deposition is carried out includes the vapor deposition unnecessary region and (ii) an organic film that has high electrical resistance is formed by the vapor deposition.

One solution to this problem is to employ an arrangement in which vapor deposition is blocked by use of a shutter so that vapor deposition is not carried out in the vapor deposition unnecessary region.

However, such an arrangement leaves, depending on, for example, a shape of openings of a shadow mask, a region in which vapor deposition has not been carried out or a region in which vapor deposition has not been fully completed when the vapor deposition is blocked. This results in a problem that the organic film cannot have an appropriate thickness in such a region.

Another solution is to wipe away the organic film with the use of an organic solvent in a later step. However, such a method undesirably generates a residue of the organic solvent and introduces dust, and, as a consequence, decreases reliability of a product. In addition, such a method necessitates another step of wiping away the organic film. This means an increase in the number of steps, inviting an increase in time and cost for production.

The present invention was accomplished in view of the above problems, and an object of the present invention is to provide a film formation substrate and an organic EL device each of which makes it possible to prevent vapor deposition in a vapor deposition unnecessary region while preventing or suppressing a decline in reliability of a product.

Solution to Problem

In order to attain the above object, a film formation substrate of the present invention on which vapor-deposited sections are formed by use of a vapor deposition device which includes (i) a vapor deposition source having injection holes from which vapor deposition particles are injected and (ii) a vapor deposition mask facing the vapor deposition source and having a plurality of openings through which the vapor deposition particles injected from the injection holes are deposited so as to form the vapor-deposited sections, includes: a plurality of pixels two-dimensionally arranged in a pixel region; and a plurality of wires electrically connected to the respective plurality of pixels, the vapor-deposited sections being formed with gaps therebetween in a region including the pixel region by injecting the vapor deposition particles from the injection holes while moving the film formation substrate relative to the vapor deposition mask in a direction so that the pixel region passes a region facing the plurality of openings, and the plurality of wires having respective terminals that are disposed in the gaps.

According to the invention, vapor-deposited films are formed by moving the film formation substrate relative to the vapor deposition mask in a direction. This makes it possible to use a vapor deposition mask that is small in size. Use of such a small-size vapor deposition mask does not cause problems, such as self-weight bending and elongation, which arise from an increase in size of a vapor deposition mask. It is therefore possible not only to form a pattern of a vapor-deposited layer on a large-sized substrate, but also to form such a pattern with high positional accuracy and high resolution.

Further, use of such a small-size vapor deposition mask makes it possible to suppress or prevent problems which occur in a case where an increase in size of a vapor deposition mask causes a frame for holding the vapor deposition mask to be extremely large and extremely heavy.

In addition, the film formation substrate of the present invention is arranged such that terminals of a plurality of wires electrically connected to respective pixels in the pixel region are each provided in a corresponding one of the gaps between the vapor-deposited sections formed corresponding to the plurality of openings of the vapor deposition mask.

Accordingly, even by injecting the vapor deposition particles from the injection holes while moving the film formation substrate relative to the vapor deposition mask in a direction, no vapor-deposited layer is formed in regions where the terminals of the plurality of wires are provided. It is therefore possible to provide a film formation substrate which makes it possible to prevent vapor deposition in vapor deposition unnecessary regions while preventing or suppressing a decline in reliability of a product.

Advantageous Effects of Invention

As described above, the film formation substrate of the present invention on which vapor-deposited sections are formed by use of a vapor deposition device which includes (i) a vapor deposition source having injection holes from which vapor deposition particles are injected and (ii) a vapor deposition mask facing the vapor deposition source and having a plurality of openings through which the vapor deposition particles injected from the injection holes are deposited so as to form the vapor-deposited sections, includes: a plurality of pixels two-dimensionally arranged in a pixel region; and a plurality of wires electrically connected to the respective plurality of pixels, the vapor-deposited sections being formed with gaps therebetween in a region including the pixel region by injecting the vapor deposition particles from the injection holes while moving the film formation substrate relative to the vapor deposition mask in a direction so that the pixel region passes a region facing the plurality of openings, and the plurality of wires having respective terminals that are disposed in the gaps.

The arrangement makes it possible to provide a film formation substrate which makes it possible to prevent vapor deposition in a vapor deposition unnecessary region while preventing or suppressing a decline in reliability of a product.

Figure 5:
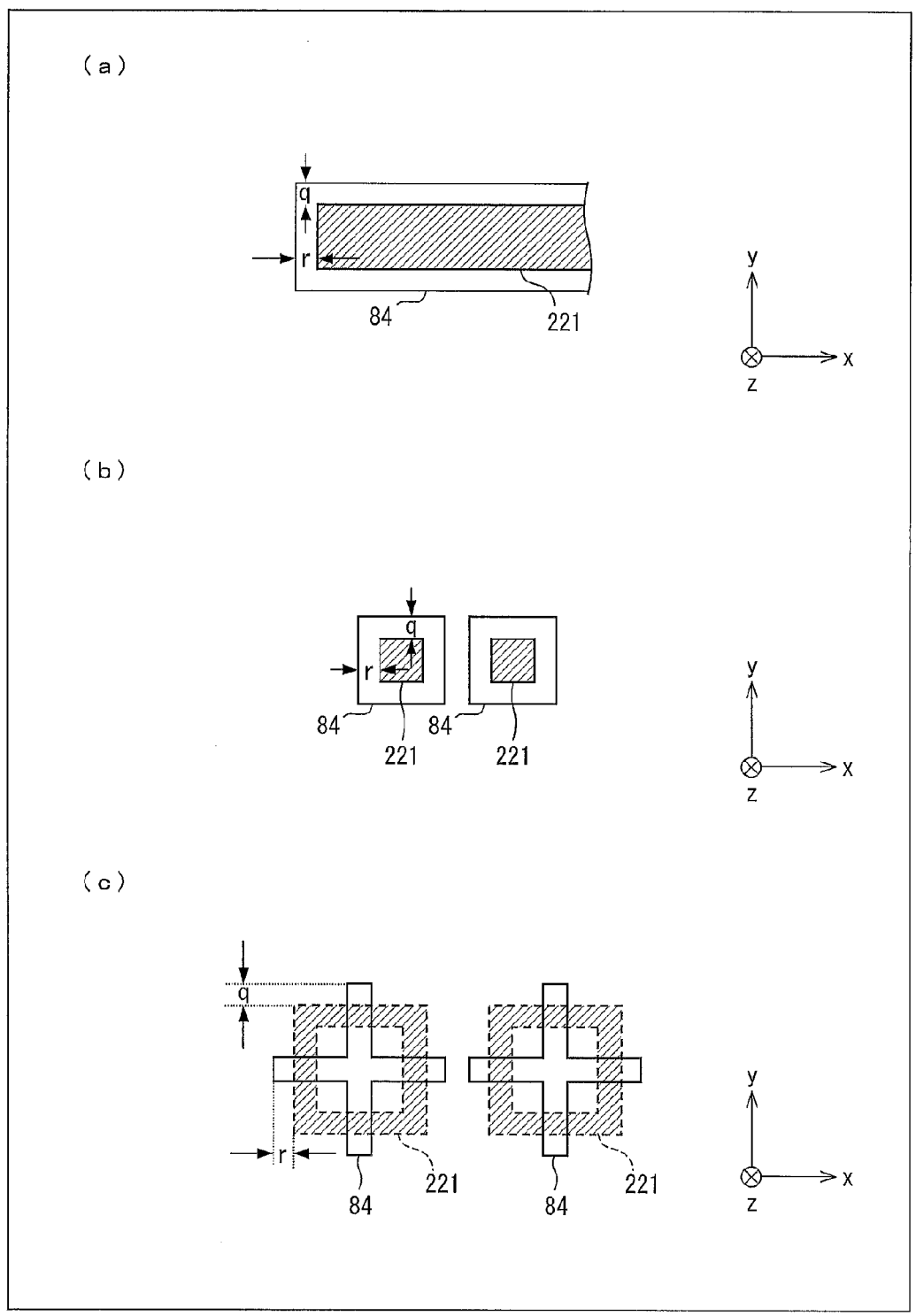

(a) through (c) of FIG. 5 are each a diagram illustrating example shapes of alignment markers provided to the film formation substrate and a vapor deposition mask according to the embodiment of the present invention.

FIG. 6 is a cross-sectional view schematically illustrating a configuration of an organic EL display device for carrying out an RGB full color display.

Figure 7:
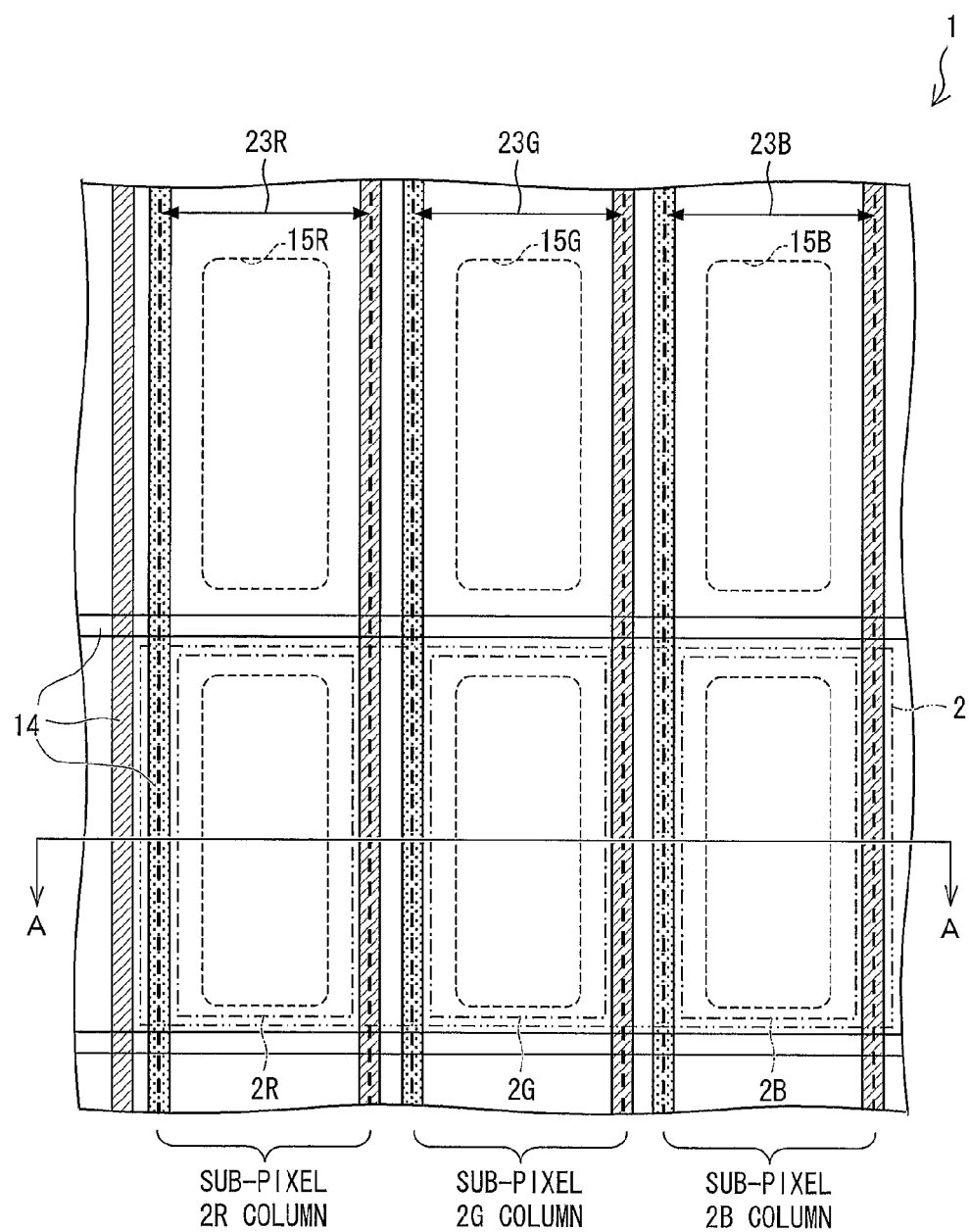

FIG. 7 is a plan view illustrating an arrangement of pixels constituting the organic EL display device illustrated in FIG. 6.

FIG. 8 is a cross-sectional view, taken along line A-A, illustrating a TFT substrate in the organic EL display device illustrated in FIG. 7.

Figure 9:
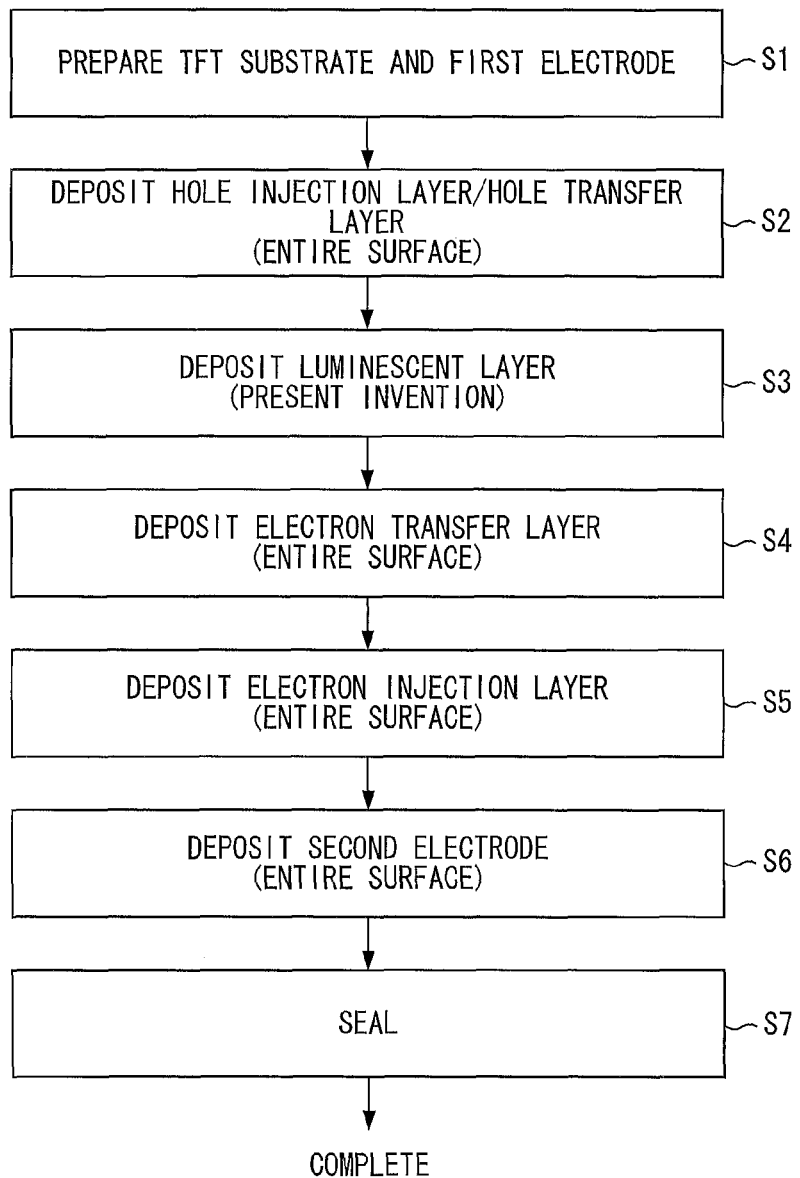

FIG. 9 is a flowchart indicating successive steps for producing the organic EL display device according to the embodiment of the present invention.

Figure 10:
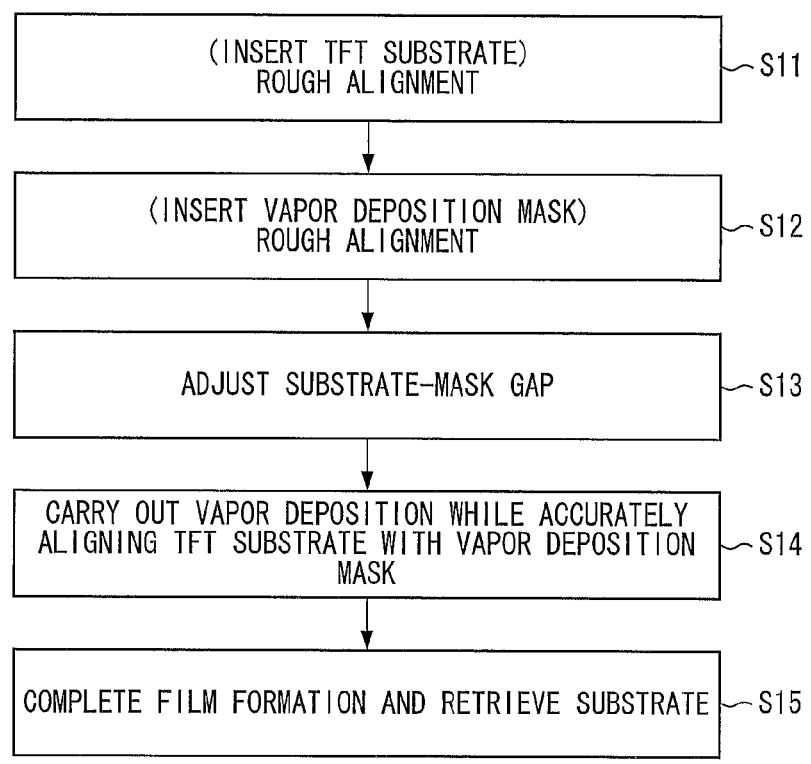

FIG. 10 is a flowchart indicating an example method for forming a predetermined pattern on a TFT substrate with use of the vapor deposition device according to the embodiment of the present invention.

Figure 11:
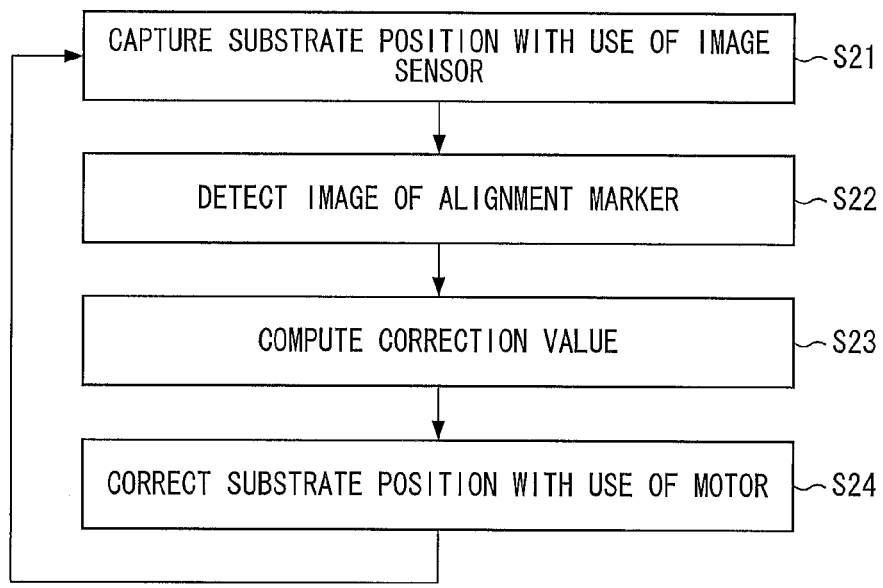

FIG. 11 is a flowchart indicating an alignment adjustment method.

Figure 12:
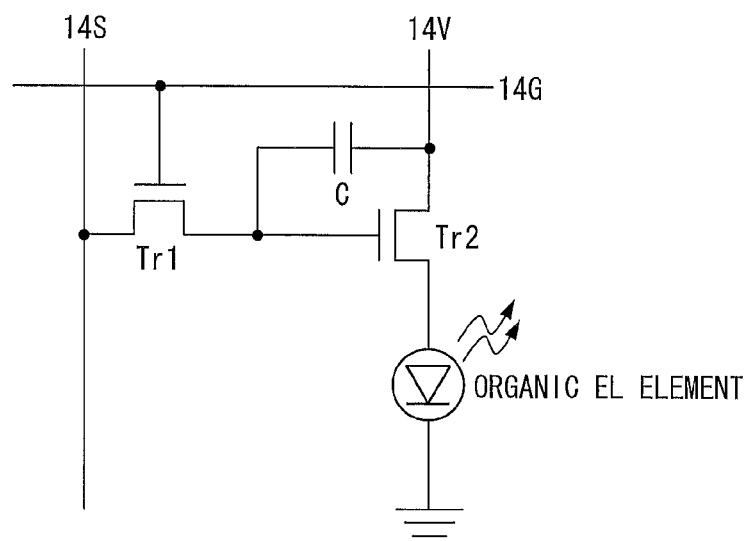

FIG. 12 is a view illustrating a configuration of a TFT circuit.

Figure 13:
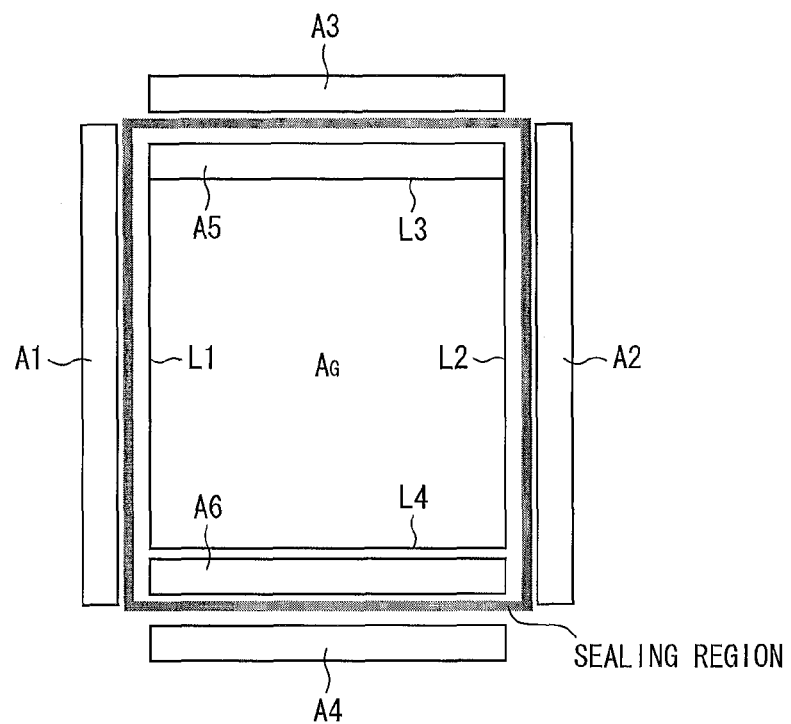

FIG. 13 is a view schematically illustrating how a TFT substrate is configured before formation of luminescent layers.

Figure 14:
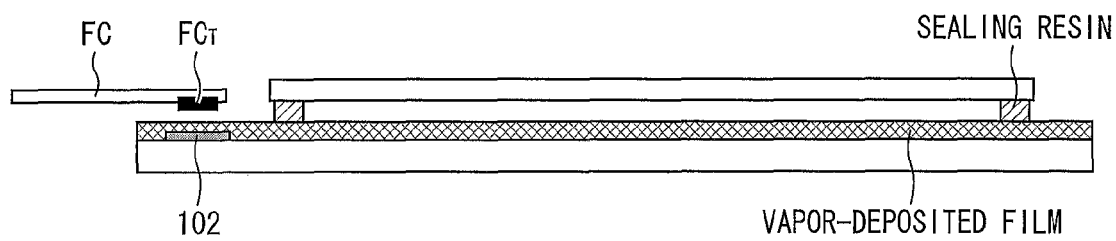

FIG. 14 is a view illustrating a state where the TFT substrate 10 sealed by a sealing substrate is about to be connected to a flexible film cable.

Figure 15:
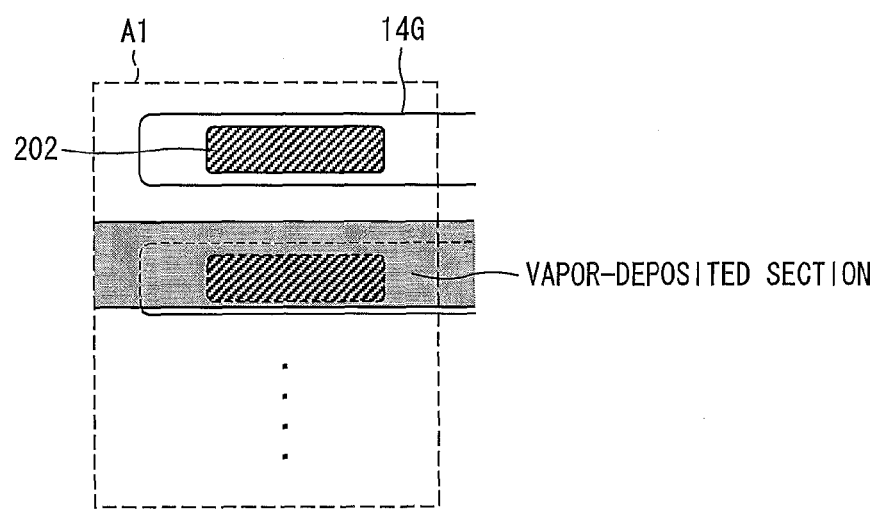

FIG. 15 is a view illustrating a region around terminals of wires in a vertical-side terminal section region.

Figure 16:
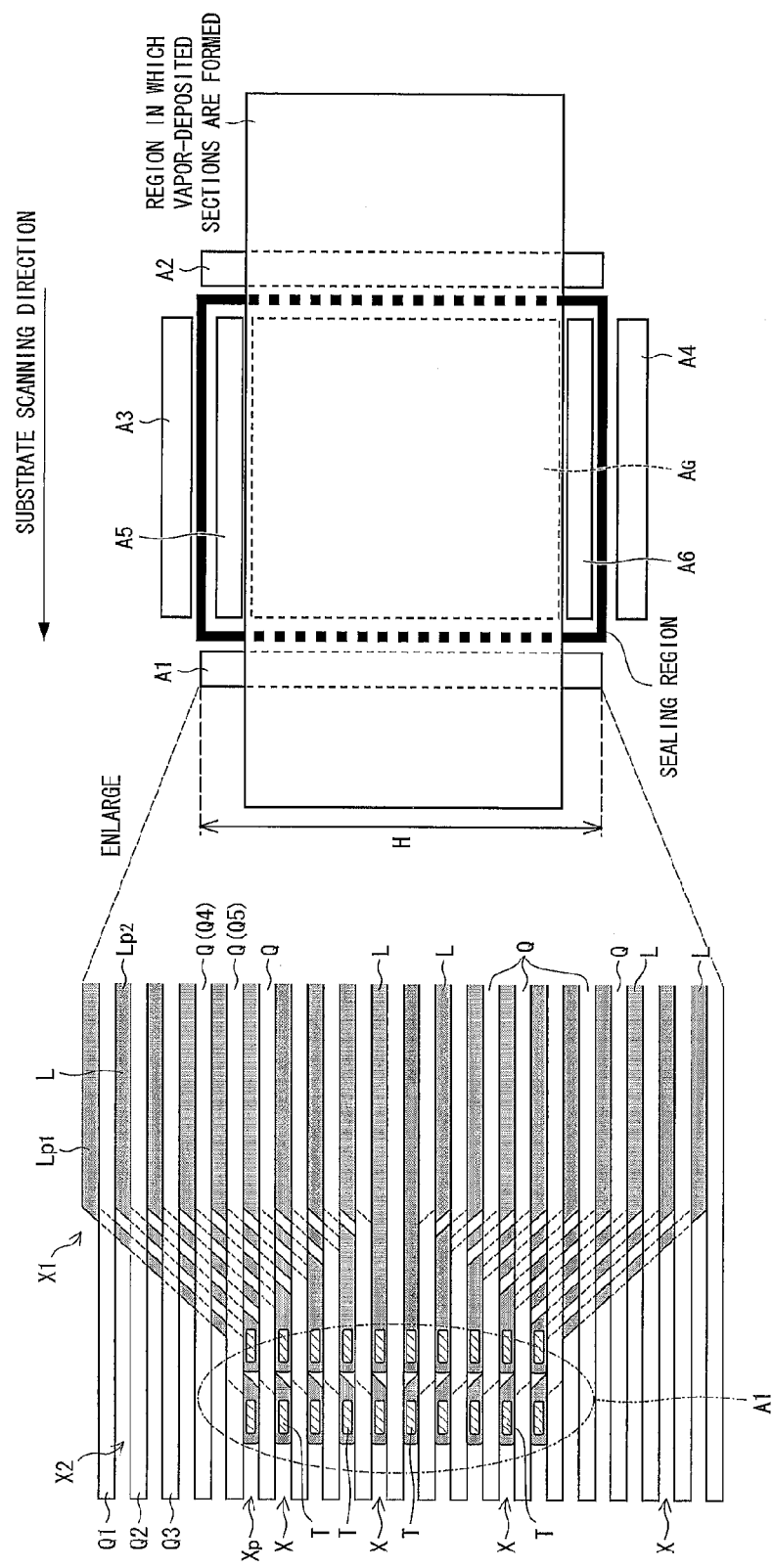

FIG. 16 is a view illustrating how a plurality of wires are disposed.

Figure 17:
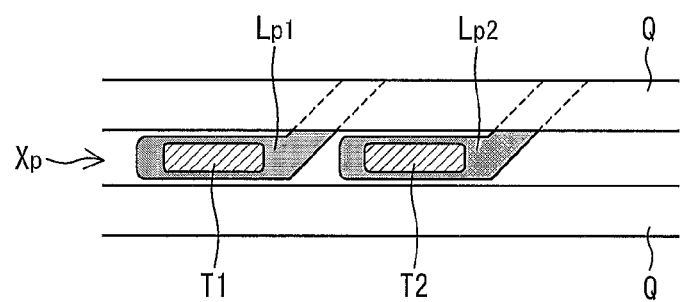

FIG. 17 is a view illustrating a configuration of a TFT substrate according to the present embodiment.

Figure 18:
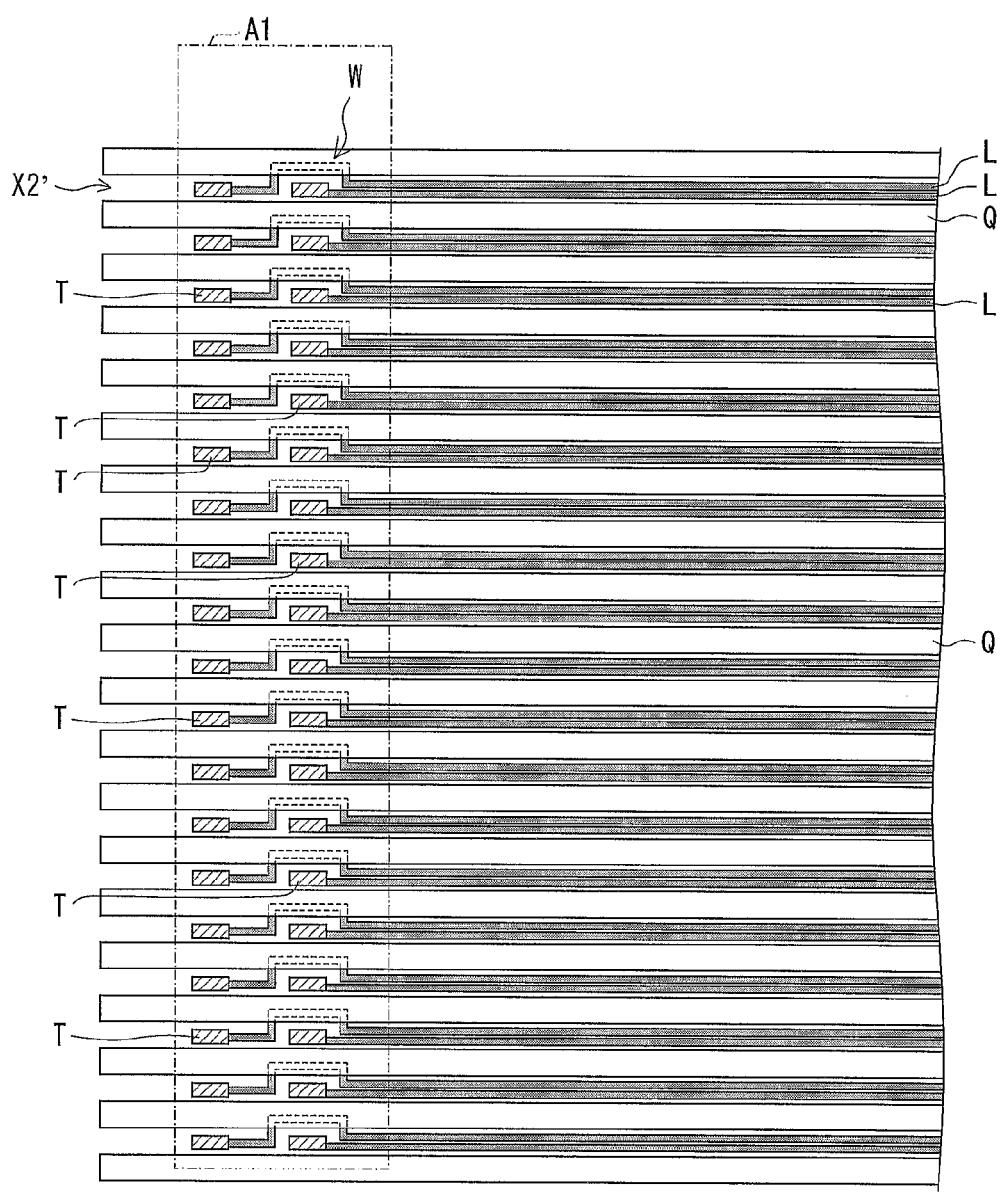

FIG. 18 is a view schematically illustrating a configuration of a TFT substrate (film formation substrate) according to Second Embodiment.

FIG. 19 is an enlarged view illustrating a structure around the terminals of the wires illustrated in FIG. 18.

FIG. 20 is a cross-sectional view schematically illustrating a configuration of a conventional vapor deposition device using a shadow mask.

DESCRIPTION OF EMBODIMENTS

First Embodiment

First Embodiment of the present invention is described below with reference to FIG. 1 through 19.

The present embodiment describes, as an example vapor deposition method involving a vapor deposition device of the present embodiment, a method for producing an organic EL display device that (i) is of a bottom emission type, that is, extracts light from a TFT substrate side, and that (ii) carries out an RGB full color display.

The description first deals with the overall configuration of the organic EL display device.

FIG. 6 is a cross-sectional view schematically illustrating a configuration of the organic EL display device that carries out an RGB full color display. FIG. 7 is a plan view illustrating an arrangement of pixels included in the organic EL display device illustrated in FIG. 6. FIG. 8 is a cross-sectional view, taken long line A-A in FIG. 7, of a TFT substrate included in the organic EL display device illustrated in FIG. 6.

As illustrated in FIG. 6, the organic EL display device 1 produced in the present embodiment includes: a TFT substrate 10 including TFTs 12 (see FIG. 8); organic EL elements 20 provided on the TFT substrate 10 and connected to the TFTs 12; an adhesive layer 30; and a sealing substrate 40 arranged in that order.

The organic EL elements 20, as illustrated in FIG. 6, are contained between the TFT substrate 10 and the sealing substrate 40 by attaching the TFT substrate 10, on which the organic EL elements 20 are provided, to the sealing substrate 40 with use of the adhesive layer 30.

The organic EL display device 1, in which the organic EL elements 20 are contained between the TFT substrate 10 and the sealing substrate 40 as described above, prevents infiltration of oxygen, moisture and the like present outside into the organic EL elements 20.

As illustrated in FIG. 8, the TFT substrate 10 includes, as a supporting substrate, a transparent insulating substrate 11 such as a glass substrate. The insulating substrate 11 is, as illustrated in FIG. 7, provided with a plurality of wires 14 including (i) a plurality of gate lines 14G (see FIG. 12) laid in the horizontal direction, (ii) a plurality of source lines 14S (see FIG. 12) laid in the vertical direction and intersecting with the gate lines 14G, and (iii) power supply wires 14V (see FIG. 12). The gate lines 14G are connected to a gate line driving circuit (not shown in the drawings) that drives the gate lines 14G, whereas the signal lines are connected to a signal line driving circuit (not shown in the drawings) that drives the signal lines. How the wires 14 of the TFT substrate 10 of the present embodiment are designed is described later.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a luminescent region of R, G, or B for each sub-pixel.

A pixel 2 (that is, a single pixel) includes three sub-pixels: a red sub-pixel 2R transmitting red light; a green sub-pixel 2G transmitting green light; and a blue sub-pixel 2B transmitting blue light.

The sub-pixels 2R, 2G, and 2B include, as luminescent regions of the respective colors which luminescent regions perform light emission of the respective sub-pixels 2R, 2G, and 2B, openings 15R, 15G, and 15B that are covered respectively by stripe-shaped luminescent layers 23R, 23G, and 23B of the respective colors.

The luminescent layers 23R, 23G, and 23B are each formed in a pattern by vapor deposition. The openings 15R, 15G, and 15B are described below in detail.

The sub-pixels 2R, 2G, and 2B include respective TFTs 12 each connected to a first electrode 21 of a corresponding one of the organic EL elements 20. The sub-pixels 2R, 2G, and 2B each have an emission intensity that is determined by scan through the wires 14 and selection of the TFTs 12. As described above, the organic EL display device 1 carries out an image display by selectively causing the organic EL elements 20 to emit, by use of the TFTs 12, light with desired luminance.

The following describes in detail respective configurations of the TFT substrate 10 and each of the organic EL elements 20 both included in the organic EL display device 1.

The description below first deals with the TFT substrate 10.

The TFT substrate 10, as illustrated in FIG. 8, includes on a transparent insulating substrate 11 such as a glass substrate: TFTs 12 (switching elements); an interlayer film 13 (interlayer insulating film; planarizing film); wires 14; and an edge cover 15, formed in that order.

The insulating substrate 11 is provided thereon with (i) wires 14 and (ii) pixel driving circuits including TFTs 12 corresponding respectively to the sub-pixels 2R, 2G, and 2B. FIG. 12 is a diagram illustrating an example of a circuit configuration of a pixel driving circuit.

As illustrated in FIG. 12, the pixel driving circuit includes a transistor Tr1 for control, a transistor Tr2 for driving, and a capacitor C.

A source terminal of the transistor Tr1 is connected to a source line 14S, a gate terminal of the transistor Tr1 is connected to a gate line 14G, and a drain terminal of the transistor Tr1 is connected to a gate terminal of the transistor Tr2.

A source terminal of the transistor Tr2 is connected to a power supply wire 14V, and a drain terminal of the transistor Tr2 is connected to the organic EL element 20.

The capacitor C is provided between the source terminal of the transistor Tr2 and the gate terminal of the transistor Tr2. The capacitor C is a capacitor for voltage retention.

When data is written into the pixel driving circuit having such a configuration, the gate line 14G becomes H (High), which causes the transistor Tr1 to turn on. This allows a data voltage signal supplied from the source line 14S to be written into the capacitor C. Then, the gate line 14G becomes L (Low), which causes the transistor Tr1 to turn off. This cuts connection between the capacitor C and the source line 14S, thereby allowing the capacitor C to retain the data voltage signal written therein when data is written into the pixel driving circuit.

An electric current of the transistor Tr2 is determined depending on a voltage between two ends of the capacitor C. Accordingly, an electric current corresponding to the data voltage signal is supplied to the organic EL element.

Each of the pixel driving circuits is not limited to the configuration described above. Each of the pixel driving circuits may, for example, additionally include a circuit for compensating a variation and a change, with passage of time, in properties of the transistors Tr1 and Tr2. Such an additional circuit may necessitate a wire other than the gate line 14G, the source line 14S, and the power supply wire 14V.

The interlayer film 13 is provided on the insulating substrate 11 throughout the entire region of the insulating substrate 11 to cover the TFTs 12.

There are provided on the interlayer film 13 first electrodes 21 of the organic EL elements 20.

The interlayer film 13 has contact holes 13a for electrically connecting the first electrodes 21 of the organic EL elements 20 to the TFTs 12. This electrically connects the TFTs 12 to the organic EL elements 20 via the contact holes 13a.

The edge cover 15 is an insulating layer for preventing the first electrode 21 and a second electrode 26 of a corresponding one of the organic EL elements 20 from short-circuiting with each other due to, for example, (i) a reduced thickness of the organic EL layer in an edge section of the pattern of the first electrode 21 or (ii) an electric field concentration.

The edge cover 15 is so formed on the interlayer film 13 as to cover edge sections of the pattern of the first electrode 21.

The edge cover 15 has openings 15R, 15G, and 15B for the sub-pixels 2R, 2G, and 2B, respectively. The openings 15R, 15G, and 15B of the edge cover 15 define the respective luminescent regions of the sub-pixels 2R, 2G, and 2B.

The sub-pixels 2R, 2G, and 2B are, in other words, isolated from one another by the insulating edge cover 15. The edge cover 15 thus functions as an element isolation film as well.

The description below now deals with each of the organic EL elements 20.

The organic EL element 20 is a light-emitting element capable of high-luminance light emission based on low-voltage direct-current driving, and includes: a first electrode 21; an organic EL layer; and a second electrode 26, provided on top of one another in that order.

The first electrode 21 is a layer having the function of injecting (supplying) positive holes into the organic EL layer.

The first electrode 21 is, as described above, connected to the TFTs 12 via the contact holes 13a.

The organic EL layer provided between the first electrode 21 and the second electrode 26 includes, as illustrated in FIG. 8: a hole injection layer/hole transfer layer 22; luminescent layers 23R, 23G, and 23B; an electron transfer layer 24; and an electron injection layer 25, formed in that order from the first electrode 21 side.

The above stack order intends to use (i) the first electrode 21 as an anode and (ii) the second electrode 26 as a cathode. The stack order of the organic EL layer is reversed in the case where the first electrode 21 serves as a cathode and the second electrode 26 serves as an anode.

The hole injection layer has the function of increasing efficiency in injecting positive holes into the luminescent layers 23R, 23G, and 23B. The hole transfer layer has the function of increasing efficiency in transferring positive holes to the luminescent layers 23R, 23G, and 23B. The hole injection layer/hole transfer layer 22 is so formed uniformly throughout the entire display region of the TFT substrate 10 as to cover the first electrode 21 and the edge cover 15.

The present embodiment describes an example case involving, as the hole injection layer and the hole transfer layer, a hole injection layer/hole transfer layer 22 that integrally combines a hole injection layer with a hole transfer layer as described above. The present embodiment is, however, not limited to such an arrangement: The hole injection layer and the hole transfer layer may be provided as separate layers independent of each other.

There are provided on the hole injection layer/hole transfer layer 22 the luminescent layers 23R, 23G, and 23B so formed in correspondence with the respective sub-pixels 2R, 2G, and 2B as to cover the respective openings 15R, 15G, and 15B of the edge cover 15.

The luminescent layers 23R, 23G, and 23B are each a layer that has the function of emitting light by recombining (i) holes (positive holes) injected from the first electrode 21 side with (ii) electrons injected from the second electrode 26 side. The luminescent layers 23R, 23G, and 23B are each made of a material with high luminous efficiency, such as a low-molecular fluorescent dye and a metal complex.

The electron transfer layer 24 is a layer that has the function of increasing efficiency in transferring electrons from the second electrode 26 to the luminescent layers 23R, 23G, and 23B. The electron injection layer 25 is a layer that has the function of increasing efficiency in injecting electrons from the second electrode 26 into the electron transfer layer 24.

The electron transfer layer 24 is so provided on the luminescent layers 23R, 23G, and 23B and the hole injection layer/hole transfer layer 22 uniformly throughout the entire display region of the TFT substrate 10 as to cover the luminescent layers 23R, 23G, and 23B and the hole injection layer/hole transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 may be provided either (i) as separate layers independent of each other as described above or (ii) integrally with each other. In other words, the organic EL display device 1 may include an electron transfer layer/electron injection layer instead of the electron transfer layer 24 and the electron injection layer 25.

The second electrode 26 is a layer having the function of injecting electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminescent layers 23R, 23G, and 23B are not essential for the organic EL layer, and may thus be included as appropriate in accordance with a required property of the organic EL element 20. The organic EL layer may further include a carrier blocking layer according to need. The organic EL layer can, for example, additionally include, as a carrier blocking layer, a hole blocking layer between the luminescent layers 23R, 23G, and 23B and the electron transfer layer 24 to prevent positive holes from transferring from the luminescent layers 23R, 23G, and 23B to the electron transfer layer 24 and thus to improve luminous efficiency.

The organic EL element 20 can have, for example, any of the layered structures (1) through (8) below.

(1) first electrode/luminescent layer/second electrode (2) first electrode/hole transfer layer/luminescent layer/electron transfer layer/second electrode (3) first electrode/hole transfer layer/luminescent layer/hole blocking layer (carrier blocking layer)/electron transfer layer/second electrode (4) first electrode/hole transfer layer/luminescent layer/hole blocking layer/electron transfer layer/electron injection layer/second electrode (5) first electrode/hole injection layer/hole transfer layer/luminescent layer/electron transfer layer/electron injection layer/second electrode (6) first electrode/hole injection layer/hole transfer layer/luminescent layer/hole blocking layer/electron transfer layer/second electrode (7) first electrode/hole injection layer/hole transfer layer/luminescent layer/hole blocking layer/electron transfer layer/electron injection layer/second electrode (8) first electrode/hole injection layer/hole transfer layer/electron blocking layer (carrier blocking layer)/luminescent layer/hole blocking layer/electron transfer layer/electron injection layer/second electrode As described above, the hole injection layer and the hole transfer layer, for example, may be integrated with each other. The electron transfer layer and the electron injection layer may be integrated with each other.

The structure of the organic EL element 20 is not limited to the above example layered structure, and may be a desired layered structure according to a required property of the organic EL element 20 as described above.

The description below deals with a method for producing the organic EL display device 1.

FIG. 9 is a flowchart indicating successive steps for producing the organic EL display device 1.

As illustrated in FIG. 9, the method of the present embodiment for producing the organic EL display device 1 includes steps such as a TFT substrate and first electrode preparing step (S1), a hole injection layer/hole transfer layer vapor deposition step (S2), a luminescent layer vapor deposition step (S3), an electron transfer layer vapor deposition step (S4), an electron injection layer vapor deposition step (S5), a second electrode vapor deposition step (S6), and a sealing step (S7).

The following describes, with reference to the flowchart illustrated in FIG. 9, the individual steps described above with reference to FIGS. 7 and 8.

Note, however, that the dimensions, materials, shapes and the like of the respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 26 as a cathode. In the converse case where the first electrode 21 serves as a cathode and the second electrode 26 serves as an anode, the stack order of the organic EL layer is reversed, and the respective materials of the first electrode 21 and the second electrode 26 are switched similarly.

First, as illustrated in FIG. 8, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 to 1.1 mm, (ii) a length (longitudinal length) of 400 to 500 mm along a y axis direction, and (iii) a length (lateral length) of 300 to 400 mm along an x axis direction. The insulating substrate 11 of the present embodiment was a glass substrate.

The interlayer film 13 can be made of, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 8.

The interlayer film 13 is simply required to have a film thickness that can compensate for the difference in level created by the TFTs 12. The film thickness is thus not particularly limited. The film thickness was, for example, approximately 2 μm in the present embodiment.

The method of the present embodiment next forms, in the interlayer film 13, contact holes 13a for electrically connecting the first electrode 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist exfoliative solution, and further washes the substrate. This forms, on the interlayer film 13, a first electrode 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method.

The thickness of the first electrode 21 is not particularly limited. The first electrode 21 can have a thickness of, for example, 100 nm as mentioned above.

The method next forms a pattern of an edge cover 15, as with the interlayer film 13, to have a film thickness of, for example, approximately 1 μm. The edge cover 15 can be made of an insulating material similar to that for the interlayer film 13.

The step described above prepares the TFT substrate 10 and the first electrode 21 (S1).

The method of the present embodiment next carries out, with respect to the TFT substrate 10 prepared through the above step, (i) a bake under a reduced pressure for dehydration and (ii) an oxygen plasma treatment for surface washing of the first electrode 21.

The method then carries out vapor deposition of a hole injection layer and a hole transfer layer (in the present embodiment, a hole injection layer/hole transfer layer 22) on the TFT substrate 10 throughout its entire display region with use of a conventional vapor deposition device (S2).

Specifically, the method (i) carries out an alignment adjustment, relative to the TFT substrate 10, of an open mask having an opening corresponding to the entire display region and (ii) closely attaches the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels having different colors and located adjacent to one another.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of an open chain conjugated system, such as a thiophene compound and an aniline compound.

The hole injection layer and the hole transfer layer may be either integrated with each other as described above or formed as separate layers independent of each other. The hole injection layer and the hole transfer layer each have a film thickness of, for example, 10 to 100 nm.

The present embodiment used, as the hole injection layer and the hole transfer layer, a hole injection layer/hole transfer layer 22 that was made of 4,4'-bis[N-(1-naphthyl)-N-phenylamino]biphenyl(a-NPD) and that had a film thickness of 30 nm.

The method of the present embodiment next carries out a selective application formation (pattern formation) of luminescent layers 23R, 23G, and 23B on the hole injection layer/hole transfer layer 22 in correspondence with respective sub-pixels 2R, 2G, and 2B so that the luminescent layers 23R, 23G, and 23B cover respective openings 15R, 15G, and 15B of the edge cover 15 (S3).

As described above, the luminescent layers 23R, 23G, and 23B are each made of a material with high luminous efficiency, such as a low-molecular fluorescent dye and a metal complex.

The luminescent layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate)aluminum complex, (iii) a bis(benzohydroxyquinolinate) beryllium complex, (iv) a tri (dibenzoylmethyl) phenanthroline europium complex, (v) and dituluoyl vinyl biphenyl.

The luminescent layers 23R, 23G, and 23B each have a film thickness of, for example, 10 to 100 nm.

The vapor deposition method and the vapor deposition device of the present embodiment are each particularly suitably used for a selective application formation (pattern formation) of such luminescent layers 23R, 23G, and 23B.

A description below deals in detail with a selective application formation of the luminescent layers 23R, 23G, and 23B which selective application formation involves the vapor deposition method and the vapor deposition device of the present embodiment.

The method of the present embodiment next carries out, in a manner similar to that described for the above hole injection layer/hole transfer layer vapor deposition step (S2), vapor deposition of an electron transfer layer 24 throughout the entire display region of the TFT substrate 10 so that the electron transfer layer 24 covers the hole injection layer/hole transfer layer 22 and the luminescent layers 23R, 23G, and 23B (S4).

The method then carries out, in a manner similar to that described for the above hole injection layer/hole transfer layer vapor deposition step (S2), vapor deposition of an electron injection layer 25 throughout the entire display region of the TFT substrate 10 so that the electron injection layer 25 covers the electron transfer layer 24 (S5).

The electron transfer layer 24 and the electron injection layer 25 are each made of a material such as a tris(8-hydroxyquinolinate)aluminum complex, an oxadiazole derivative, a triazole derivative, a phenylquinoxaline derivative, or a silole derivative.

Specific examples of the material include (i) Alq(tris(8-hydroxy quinoline)aluminum), anthracene, naphthalene, phenanthrene, pyrene, anthracene, perylene, butadiene, coumarin, acridine, stilbene, 1,10-phenanthroline, and a derivative or metal complex of any of the above, and (ii) LiF.

As mentioned above, the electron transfer layer 24 and the electron injection layer 25 may be either integrated with each other or formed as separate layers independent of each other. The electron transfer layer 24 and the electron injection layer 25 each have a film thickness of, for example, 1 to 100 nm. The respective film thicknesses of the electron transfer layer 24 and the electron injection layer 25 add up to, for example, 20 to 200 nm.

In the present embodiment, (i) the electron transfer layer 24 was made of Alq, whereas the electron injection layer 25 was made of LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection layer/hole transfer layer vapor deposition step (S2), vapor deposition of a second electrode 26 throughout the entire display region of the TFT substrate 10 so that the second electrode 26 covers the electron injection layer 25 (S6).

The second electrode 26 is suitably made of a material (electrode material) such as a metal with a small work function. Examples of such an electrode material include a magnesium alloy (for example, MgAg), an aluminum alloy (for example, AlLl, AlCa, or AlMg) and calcium metal. The second electrode 26 has a thickness of, for example, 50 to 100 nm.

In the present embodiment, the second electrode 26 was made of aluminum and has a film thickness of 50 nm. The operation described above forms, on the TFT substrate 10, organic EL elements 20 each including the organic EL layer, the first electrode 21, and the second electrode 26 described above.

The method of the present embodiment then attached (i) the TFT substrate 10, on which the organic EL elements 20 are provided, to (ii) a sealing substrate 40 with use of an adhesive layer 30 as illustrated in FIG. 6 so that the organic EL elements 20 were contained.

The sealing substrate 40 is, for example, an insulating substrate such as a glass substrate and a plastic substrate and 0.4 to 1.1 mm in thickness. The sealing substrate 40 of the present embodiment was a glass substrate.

The longitudinal and lateral lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL elements 20 contained therebetween is divided in accordance with the size of a target organic EL display device 1.

The method for containing the organic EL elements 20 is not limited to the method described above. Examples of other containing methods include (i) a method that uses a centrally depressed glass substrate as the sealing substrate 40 and that the combination of the sealing substrate 40 and the TFT substrate 10 is sealed along the edge in a frame shape with use of, for example, a sealing resin or fritted glass, and (ii) a method that fills a space between the TFT substrate 10 and the sealing substrate 40 with a resin. The method for producing the organic EL display device 1 does not depend on the above containing method, and can employ any of various containing methods.

The second electrode 26 may be provided thereon with a protective film (not shown) that covers the second electrode 26 and that prevents infiltration of oxygen, moisture and the like present outside into the organic EL elements 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1, upon receipt of a signal through a wire 14, turns on a TFT 12 (turns on both a transistor Tr1 and a transistor Tr2) and thus allows (i) positive holes to be injected from the first electrode 21 into the organic EL layer and further (ii) electrons to be injected from the second electrode 26 into the organic EL layer. This causes the positive holes and the electrons to recombine with each other inside the luminescent layers 23R, 23G, and 23B. The positive holes and the electrons thus recombined are emitted in the form of light when becoming inactive.

In the above organic EL display device 1, controlling respective light emission luminances of the sub-pixels 2R, 2G, and 2B allows a predetermined image to be displayed.

The following describes an arrangement of a vapor deposition device of the present embodiment.

Figure 1:
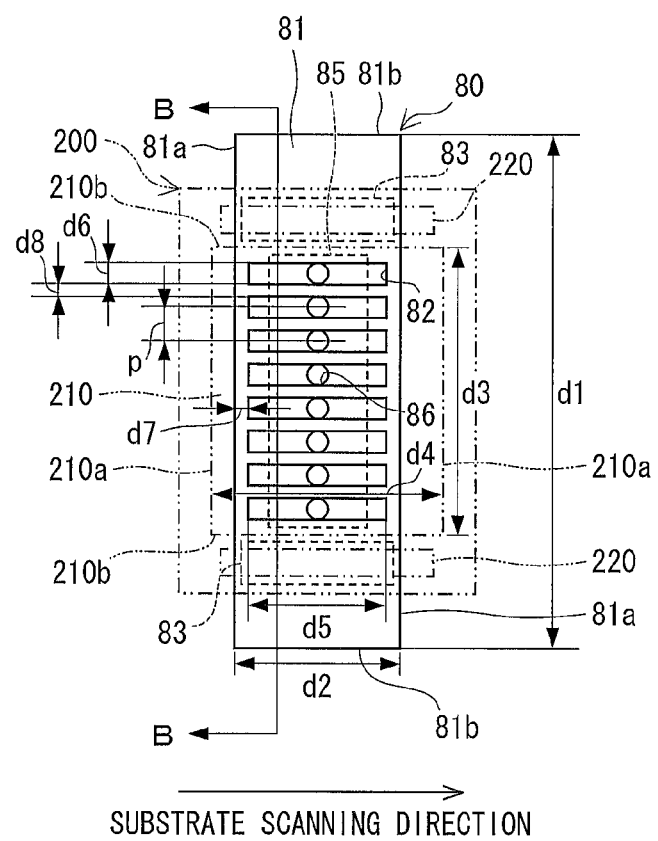
FIG. 1 is a plan view illustrating a film formation substrate and a mask unit inside a vacuum chamber of a vapor deposition device according to an embodiment of the present invention, the plan view being taken from a back surface side of the film formation substrate.
Figure 2:
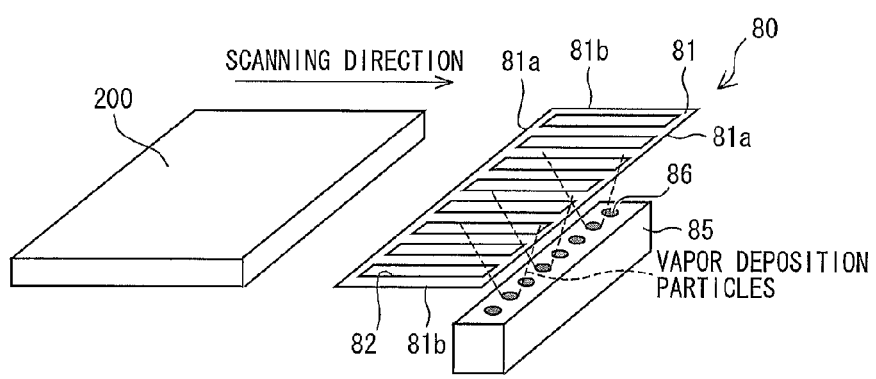
FIG. 2 is a bird's eye view illustrating main constituent elements inside the vacuum chamber of the vapor deposition device according to the embodiment of the present invention.
Figure 3:
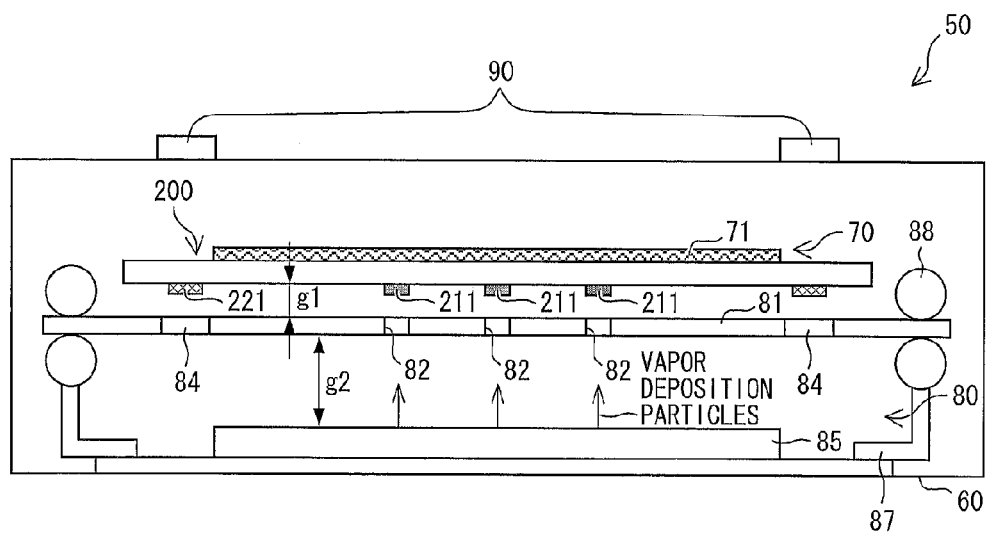
FIG. 3 is a cross-sectional view schematically illustrating a configuration of a main part of the vapor deposition device according to the embodiment of the present invention.
Figure 4:
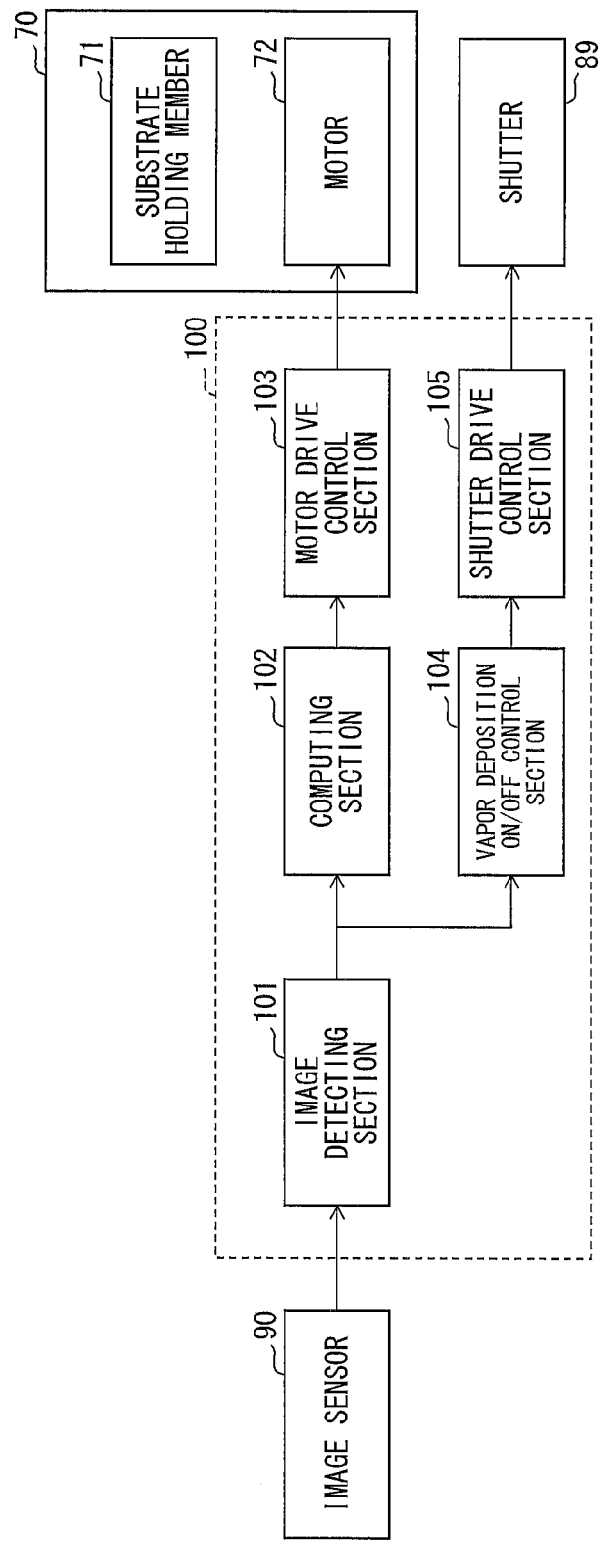
FIG. 4 is a block diagram partially illustrating a configuration of the vapor deposition device according to the embodiment of the present invention.

FIG. 1 is a plan view of a film formation substrate and a mask unit both inside a vacuum chamber of the vapor deposition device of the present embodiment, the plan view being taken from a back surface side of the film formation substrate (that is, the side opposite to the vapor-deposited surface). For convenience of illustration, FIG. 1 uses a chain double-dashed line to represent the film formation substrate. FIG. 2 is a bird's eye view of main constituent elements inside the vacuum chamber of the vapor deposition device of the present embodiment. FIG. 3 is a cross-sectional view schematically illustrating a configuration of a main part of the vapor deposition device of the present embodiment. FIG. 3 illustrates a cross section of the vapor deposition device, the cross section being taken along line B-B of FIG. 1. FIG. 4 is a block diagram illustrating a part of a configuration of the vapor deposition device of the present embodiment.

The vapor deposition device 50 of the present embodiment, as illustrated in FIG. 3, includes: a vacuum chamber 60 (film growing chamber); a substrate moving mechanism 70 (substrate moving means; moving means); a mask unit 80; image sensors 90; and a control circuit 100 (see FIG. 4).

As illustrated in FIG. 3, the vacuum chamber 60 contains the substrate moving mechanism 70 and the mask unit 80.

The vacuum chamber 60 is provided with a vacuum pump (not shown) for vacuum-pumping the vacuum chamber 60 via an exhaust port (not shown) of the vacuum chamber 60 to keep a vacuum in the vacuum chamber 60 during vapor deposition.

The substrate moving mechanism 70 includes, for example: a substrate holding member 71 (substrate holding means) for holding a film formation substrate 200 (for example, a TFT substrate 10); and a motor 72 (see FIG. 4).

The substrate moving mechanism 70 causes (i) the substrate holding member 71 to hold the film formation substrate 200 and (ii) a below-described motor drive control section 103 (see FIG. 4) to drive the motor 72 so as to hold the film formation substrate 200 and move it in the horizontal direction. The substrate moving mechanism 70 may be provided to be capable of moving the film formation substrate 200 either (i) in both the x axis direction and the y axis direction or (ii) in one of the x axis direction and the y axis direction.

The substrate holding member 71 is an electrostatic chuck. The film formation substrate 200 is, in a state in which bend due to its own weight is absent, so held by the electrostatic chuck as to be separated from a below-described shadow mask 81 of the mask unit 80 by a fixed gap g1 (void; vertical distance).

The gap g1 between the film formation substrate 200 and the shadow mask 81 preferably falls within the range of not less than 50 μm and not more than 3 mm, or is more preferably on the order of 200 μm.

If the gap g1 is smaller than 50 μm, the film formation substrate 200 will likely become into contact with the shadow mask 81.

If the gap g1 is larger than 3 mm, vapor deposition particles that have passed through openings 82 of the shadow mask 81 are spread widely, which results in a vapor-deposited film 211 being formed to have too large a pattern width. In the case where, for example, the vapor-deposited film 211 is the luminescent layer 23R, the gap g1 being larger than 3 mm may undesirably result in vapor deposition of the material of the luminescent layer 23R through the respective openings 15G and 15B of the adjacent sub-pixels 2G and 2B.

With the gap g1 being approximately 200 μm, (i) there is no risk of the film formation substrate 200 coming into contact with the shadow mask 81, and (ii) the vapor-deposited film 211 can have a sufficiently small pattern width.

The mask unit 80, as illustrated in FIG. 3, includes: a shadow mask 81 (vapor deposition mask; mask); a vapor deposition source 85; a mask holding member 87 (holding means); a mask tension mechanism 88; and a shutter 89 (see FIG. 4).

The shadow mask 81 is, for example, a metal mask.

The shadow mask 81 is so formed as to (i) be smaller in area than a vapor deposition region 210 of the film formation substrate 200 and (ii) have at least one side that is shorter than the width of the vapor deposition region 210 of the film formation substrate 200.

The shadow mask 81 of the present embodiment has a rectangular shape (that is, in the shape of a belt), and is sized as follows: The shadow mask 81 is, as illustrated in FIG. 1, so formed as to have (i) long sides 81a each with a width d1 (that is, the length along the long-side direction [long-axis direction] of the shadow mask 81) that is larger than the width d3 of a side of the vapor deposition region 210 (in the example illustrated in FIG. 1, a long side 210a of the vapor deposition region 210) which side faces the long sides 81a of the shadow mask 81 and (ii) short sides 81b each with a width d2 (that is, the length along the short-side direction [short-axis direction] of the shadow mask 81) that is smaller than the width d4 of a side of the vapor deposition region 210 (in the example illustrated in FIG. 1, a short side 210b of the vapor deposition region 210) which side faces the short sides 81b of the shadow mask 81.

The shadow mask 81, as illustrated in FIGS. 1 and 2, has a plurality of openings 82 (through holes) arranged in a one-dimensional direction and each having the shape of, for example, a belt (that is, in a stripe shape). In the case where, for example, a selective application formation of the luminescent layers 23R, 23G, and 23B is carried out with respect to the TFT substrate 10 as a pattern formation of vapor-deposited films 211 (see FIG. 3) on the film formation substrate 200, the openings 82 are formed in correspondence with the size and pitch of columns for each color of the luminescent layers 23R, 23G, and 23B.

The shadow mask 81, as illustrated in FIG. 1, includes, for example, alignment marker sections 83 extending along a scanning direction (substrate scanning direction) of the film formation substrate 200. The alignment marker sections 83 include respective alignment markers 84 (see FIG. 3) for use in an alignment between the film formation substrate 200 and the shadow mask 81.

The alignment marker sections 83 of the present embodiment are, as illustrated in FIG. 1, provided along the short sides 81b (short axis) of the shadow mask 81.

The shadow mask 81, as described above, has (i) long sides 81a each with a width d1 that is larger than the width d3 of a side of the vapor deposition region 210 which side faces the long sides 81a and (ii) short sides 81b each with a width d2 that is smaller than the width d4 of a side of the vapor deposition region 210 which side faces the short sides 81b. This arrangement allows the alignment marker sections 83 to be formed respectively in opposite end sections arranged along the long-side direction (that is, at the opposite short sides 81b and 81b). The above arrangement thus makes it possible to carry out an alignment easily and more precisely.

The film formation substrate 200, as illustrated in FIG. 1, includes alignment marker sections 220 outside the vapor deposition region 210 and along the scanning direction (substrate scanning direction) of the film formation substrate 200. The alignment marker sections 220 include respective alignment markers 221 (see FIG. 3) for use in an alignment between the film formation substrate 200 and the shadow mask 81.

The alignment marker sections 220 of the present embodiment are, as illustrated in FIG. 1, provided along the respective short sides 210b (short axis) of the vapor deposition region 210 of the film formation substrate 200.

The stripe-shaped openings 82 of the present embodiment are provided to (i) extend along the short side direction of the shadow mask 81, that is, the substrate scanning direction, and to (ii) be arranged next to one another along the long side direction of the shadow mask 81, that is, a direction that orthogonally crosses the substrate scanning direction.

The vapor deposition source 85 is, for example, a container that contains a vapor deposition material. The vapor deposition source 85 is, as illustrated in FIG. 1 through 3, (i) placed to face the shadow mask 81 and (ii) separated from the shadow mask 81 by a fixed gap g2 (void), that is, positioned away from the shadow mask 81 by a fixed distance.

The vapor deposition source 85 may be a container that itself contains a vapor deposition material or a container that includes a load-lock pipe.

The vapor deposition source 85 includes, for example, a mechanism for emitting vapor deposition particles upward.

The vapor deposition source 85 has, on a surface facing the shadow mask 81, a plurality of injection holes 86 for emitting (scattering) the vapor deposition material in the form of vapor deposition particles.

The present embodiment is arranged as described above such that (i) the vapor deposition source 85 is provided below the film formation substrate 200 and that (ii) the film formation substrate 200 is held by the substrate holding member 71 in such a state that the vapor deposition region 210 faces downward. Thus, in the present embodiment, the vapor deposition source 85 carries out vapor deposition of vapor deposition particles through the openings 82 of the shadow mask 81 onto the film formation substrate 200 upward from below (that is, up deposition; hereinafter referred to as "depo-up").

The injection holes 86 are, as illustrated in FIGS. 1 and 2, provided to face the respective openings 82 of the shadow mask 81 so as to be open in respective opening regions of the shadow mask 81. The injection holes 86 of the present embodiment are arranged one-dimensionally (i) along the direction in which the openings 82 of the shadow mask 81 are arranged next to one another and (ii) so as to face the respective openings 82 of the shadow mask 81.

Thus, as illustrated in FIGS. 1 and 2, the vapor deposition source 85 is formed to have a surface that faces the shadow mask 81, the surface (that is, the surface in which the injection holes 86 are provided) having, for example, a rectangular shape (belt shape) as viewed from the back surface side of the film formation substrate 200 (that is, in a plan view) so as to match the rectangular shape (belt shape) of the shadow mask 81.

In the mask unit 80, the shadow mask 81 and the vapor deposition source 85 are fixed in position relative to each other. Specifically, there is constantly a fixed gap g2 between (i) the shadow mask 81 and (ii) the surface of the vapor deposition source 85 in which surface the injection holes 86 are provided, and there is constantly a fixed positional relationship between (i) the openings 82 of the shadow mask 81 and (ii) the injection holes 86 of the vapor deposition source 85.

The injection holes 86 of the vapor deposition source 85 are each so placed as to coincide with the center of a corresponding opening 82 of the shadow mask 81 when the mask unit 80 is viewed from the back surface side of the film formation substrate 200 (that is, in a plan view).

The shadow mask 81 and the vapor deposition source 85 are, for example, attached to the mask holding member 87 (for example, an identical holder) for holding and fixing (i) the shadow mask 81 via the mask tension mechanism 88 and (ii) the vapor deposition source 85 (see FIG. 3). The shadow mask 81 and the vapor deposition source 85 are thus so integrated with each other as to be held and fixed in the respective positions relative to each other.

The shadow mask 81 is under tension caused by the mask tension mechanism 88. The shadow mask 81 is thus adjusted as appropriate so that no bend or elongation due to its own weight is caused.

The vapor deposition device 50 is arranged as described above such that (i) the film formation substrate 200 is adhered by suction to a fixing plate by the substrate holding member 71 (electrostatic chuck), and is thus prevented from being bent due to its own weight and (ii) the shadow mask 81 is under tension caused by the mask tension mechanism 88 so that the distance between the film formation substrate 200 and the shadow mask 81 is uniformly maintained throughout the entire region by which the film formation substrate 200 overlaps the shadow mask 81 in a plan view.

The shutter 89 is used according to need in order to control reaching of vapor deposition particles to the shadow mask 81. The shutter 89 is either closed or opened by a shutter drive control section 105 (see FIG. 4) in accordance with a vapor deposition OFF signal or vapor deposition ON signal from a vapor deposition ON/OFF control section 104 (see FIG. 4) described below.

The shutter 89 is, for example, provided to be capable of moving in a space between the shadow mask 81 and the vapor deposition source 85 (that is, capable of being inserted between them). The shutter 89 is inserted between the shadow mask 81 and the vapor deposition source 85 to close the openings 82 of the shadow mask 81.

The vapor deposition device 50 is so adjusted that vapor deposition particles from the vapor deposition source 85 are scattered below the shadow mask 81. The vapor deposition device 50 may be arranged such that vapor deposition particles scattered beyond the shadow mask 81 are blocked as appropriate by, for example, a deposition preventing plate (shielding plate).

The vacuum chamber 60 is provided with, for example, image sensors 90 (see FIG. 4) each (i) attached to an outer surface of the vacuum chamber 60, (ii) including a CCD, and (iii) serving as image sensing means (image reading means). The vacuum chamber 60 is further provided with a control circuit 100 (i) attached to the outer surface of the vacuum chamber 60, (ii) connected to the image sensors 90, and (iii) serving as control means.

The image sensors 90 each function as position detecting means for use in an alignment of the film formation substrate 200 and the shadow mask 81.

The control circuit 100 includes: an image detecting section 101; a computing section 102; a motor drive control section 103; a vapor deposition ON/OFF control section 104; and a shutter drive control section 105.

As described above, the film formation substrate 200 includes, as illustrated in FIG. 1, alignment marker sections 220 provided (i) outside the vapor deposition region 210 and (ii) along, for example, the substrate scanning direction, the alignment marker sections 220 each including an alignment marker 221.

The image detecting section 101 detects, on the basis of an image captured by the image sensors 90, respective images of (i) the alignment markers 221 included in the film formation substrate 200 and (ii) the alignment markers 84 of the shadow mask 81. The image detecting section 101 further detects the start-end and rear-end of the vapor deposition region 210 of the film formation substrate 200 on the basis of, among the alignment markers 221 included in the film formation substrate 200, (i) a start-end marker indicative of the start-end of the vapor deposition region 210 and (ii) a rear-end marker indicative of the rear-end of the vapor deposition region 210.

The start-end marker and the rear-end marker mentioned above may be identical to each other. In this case, the image detecting section 101 detects, with respect to the substrate scanning direction, whether a particular end of the vapor deposition region 210 is its start-end or rear-end.

The computing section 102 determines, from the image detected by the image detecting section 101, the amount of movement of the film formation substrate 200 and the shadow mask 81 relative to each other (for example, the amount of movement of the film formation substrate 200 relative to the shadow mask 81). The computing section 102, for example, measures the amount of positional difference (that is, a shift component along the x axis direction and the y axis direction, and a rotation component on the x-y plane) between the alignment markers 221 and the alignment markers 84 to determine a correction value for a substrate position of the film formation substrate 200 by computation. In other words, the computing section 102 determines the correction value by computation with respect to the direction perpendicular to the substrate scanning direction and a rotation direction of the film formation substrate 200.

The rotation direction of the film formation substrate refers to a direction of rotation on the x-y plane about a z axis, as a rotation axis, at the center of a film formation surface of the film formation substrate 200.

The correction value is outputted in the form of a correction signal to the motor drive control section 103. The motor drive control section 103, on the basis of the correction signal from the computing section 102, drives the motor 72 connected to the substrate holding member 71 and thus corrects the substrate position of the film formation substrate 200.

How the substrate position is corrected with use of the alignment markers 84 and 221 is described below together with example shapes of the alignment markers 84 and 221.

The motor drive control section 103 drives the motor 72 to move the film formation substrate 200 in the horizontal direction as mentioned above.

The vapor deposition ON/OFF control section 104 generates (i) a vapor deposition OFF signal when the image detecting section 101 detects the rear-end of the vapor deposition region 210 and (ii) a vapor deposition ON signal when the image detecting section 101 detects the start-end of the vapor deposition region 210.

The shutter drive control section 105 (i) closes the shutter 89 upon receipt of a vapor deposition OFF signal from the vapor deposition ON/OFF control section 104 and (ii) opens the shutter 89 upon receipt of a vapor deposition ON signal from the vapor deposition ON/OFF control section 104.

The following describes (i) how the substrate position is corrected with use of the alignment markers 84 and 221 and (ii) example shapes of the alignment markers 84 and 221.

(a) through (c) of FIG. 5 illustrate example shapes of the alignment markers 84 and 221. (b) and (c) of FIG. 5 each illustrate only two of the juxtaposed alignment markers 84 and of the juxtaposed alignment markers 221 for convenience of illustration.

The computing section 102, on the basis of an image of the alignment markers 84 and 221, the image having been detected by the image detecting section 101, measures (determines) (i) a distance r between respective ends (outer edges) of each alignment marker 84 and its corresponding alignment marker 221 along the x axis direction and (ii) a distance q between respective ends (outer edges) of each alignment marker 84 and its corresponding alignment marker 221 along the y axis direction. The computing section 102 thus determines the amount of positional difference in alignment to compute a correction value for a substrate position.

In the case where, for example, the substrate scanning direction is the x axis direction, the sign "r" in (a) through (c) of FIG. 5 indicates a distance between the respective ends along the substrate scanning direction, whereas the sign "q" in (a) through (c) of FIG. 5 indicates a distance between the respective ends along the direction perpendicular to the substrate scanning direction. The computing section 102 measures (determines) the distances r and q at, for example, opposite ends of the vapor deposition region 210 of the film formation substrate 200 to determine the amount of shift caused in alignment during a substrate scan.

The present embodiment describes an example case that involves simultaneously scanning the film formation substrate 200 and carrying out an alignment between the shadow mask 81 and the film formation substrate 200 as described below. The present embodiment is, however, not limited to such an arrangement. The present embodiment can alternatively be arranged such that a sufficient alignment is carried out before a substrate scan and that no alignment is carried out during a substrate scan.

The present embodiment can be arranged as in an embodiment described below such that, for example, the film formation substrate 200 is moved along a first side of the vapor deposition region 210 of the film formation substrate 200 (for example, along the y axis direction in (a) through (c) of FIG. 5), and is then moved along a second side (for example, the x axis direction in (a) through (c) of FIG. 5) orthogonal to the first side. In this case, the sign "r" in (a) through (c) of FIG. 5 indicates a distance between the respective ends along the direction perpendicular to the substrate scanning direction, whereas the sign "q" in (a) through (c) of FIG. 5 indicates a distance between the respective ends along the direction (shift direction) in which the film formation substrate 200 is moved.

In this case, the computing section 102 measures distances r and q for alignment markers located at the four corners, and thus determines (i) the amount of positional difference present in alignment at the start of a substrate scan and (ii) the amount of positional difference present in alignment after the film formation substrate 200 is moved (shifted).

The alignment markers 84 and 221 may each be, as illustrated in (a) through (c) of FIG. 5, in the shape of, for example, (i) a belt, (ii) a rectangle such as a square, (iii) a frame, or (iv) a cross. The alignment markers 84 and 221 are thus not particularly limited in terms of shape.

In the case where a sufficient alignment is carried out before a substrate scan and no alignment is carried out during a substrate scan as described above, the alignment markers 221 do not need to be provided along a side of the vapor deposition region 210 of the film formation substrate 200, and may instead be provided at, for example, the four corners of the film formation substrate 200.

The following describes in detail a method for forming a pattern of an organic EL layer by using, as a device for producing the organic EL display device 1, the above vapor deposition device 50 of the present embodiment.

The description below deals with an example case that, as described above, involves (i) using, as the film formation substrate 200, a TFT substrate 10 obtained after the hole injection layer/hole transfer layer vapor deposition step (S2) is finished and (ii) carrying out, as a pattern formation of an organic EL layer, a selective application formation of luminescent layers 23R, 23G, and 23B during the luminescent layer vapor deposition step (S3).

The present embodiment assumed (i) 100 mm for the gap g2 between the vapor deposition source 85 and the shadow mask 81 (that is, the distance between a surface of the vapor deposition source 85 in which surface the injection holes 86 are provided and the shadow mask 81) and (ii) 200 μm for the distance between the TFT substrate 10 serving as the film formation substrate 200 and the shadow mask 81.

The present embodiment further assumed (i) for a substrate size of the TFT substrate 10, 320 mm along the scanning direction and 400 mm along the direction perpendicular to the scanning direction and (ii) for widths of the vapor deposition region (display region), 260 mm for the width along the scanning direction (that is, the width d4) and 310 mm for the width (that is, the width d3) along the direction perpendicular to the scanning direction.

The present embodiment assumed 360 μm (along the scanning direction)×80 μm (along the direction perpendicular to the scanning direction) for widths of the openings 15R, 15G, and 15B for the respective sub-pixels 2R, 2G, and 2B of the TFT substrate 10. The present embodiment further assumed 480 μm (along the scanning direction)×160 μm (along the direction perpendicular to the scanning direction) for a pitch between the openings 15R, 15G, and 15B. The pitch between the openings 15R, 15G, and 15B (that is, a pitch between pixel openings) refers to a pitch between respective openings 15R, 15G, and 15B for the sub-pixels 2R, 2G, and 2B adjacent to one another, but not to a pitch between sub-pixels of an identical color.

The present embodiment used, as the shadow mask 81, a shadow mask having (i) a length of 600 mm along the width d1 (that is, the width along the direction perpendicular to the scanning direction) along each long side 81a (corresponding to the long-axis direction) and (ii) a length of 200 mm along the width d2 (that is, the width along the scanning direction) along each short side 81b (corresponding to the short-axis direction). The shadow mask 81 had openings 82 (i) each having opening widths of 150 mm (along the width d5 in the long-axis direction; see FIG. 1)×110 μm (along the width d6 in the short-axis direction; see FIG. 1), (ii) having a length of 370 μm along an interval d8 (see FIG. 1) between adjacent openings 82 and 82, and (iii) having a length of 480 μm along a pitch p (see FIG. 1) between respective centers of adjacent openings 82 and 82.

In the present embodiment, the shadow mask 81 preferably has a length of not less than 200 mm for the width d2 (that is, a short side length) along each short side 81b. This is due to the reason below.

The vapor deposition rate is preferably not higher than 10 nm/s. If the vapor deposition rate exceeds 10 nm/s, a deposited film (that is, a vapor-deposited film) will have a decreased uniformity, thus resulting in a decreased organic EL property.

A vapor-deposited film typically has a film thickness of not larger than 100 nm. A film thickness of larger than 100 nm will require application of a high voltage, and consequently increase power consumption of a produced organic EL display device. The above vapor deposition rate and the film thickness of a vapor-deposited film allow estimation of a necessary vapor deposition period of 10 seconds.

Due to a limit in processing capability (tact time), a scan rate of 13.3 mm/s or higher is at least necessary in order to, for example, complete vapor deposition with respect to a 2 m-wide glass substrate in 150 seconds. The processing time of 150 seconds is a tact time that allows processing of about 570 glass substrates per day.

Securing the above vapor deposition period of 10 seconds at the above scan rate requires the shadow mask 81 to have openings 82 each having a width of at least 133 mm along the scanning direction.

Assuming that approximately 30 mm is appropriate for the distance (margin width d7; see FIG. 1) from each end of an opening 82 to a corresponding end of the shadow mask 81, the shadow mask 81 requires a length of 133+30+30≈200 mm for the width along the scanning direction.

The shadow mask 81 thus preferably has a short side length (that is, the width d2) of not less than 200 mm. The short side length is, however, not limited to not less than 200 mm if there is a change in the vapor deposition rate, the film thickness of a vapor-deposited film, and/or the allowable amount of the tact time.

The present embodiment assumes 30 mm/s for the rate of scanning the TFT substrate 10.

FIG. 9 is a flowchart illustrating an example method for forming a predetermined pattern on the TFT substrate 10 with use of the vapor deposition device 50 of the present embodiment.

The following specifically describes, with reference to the flow illustrated in FIG. 10, a method of FIG. 8 for forming luminescent layers 23R, 23G, and 23B with use of the vapor deposition device 50.

The method first, as illustrated in FIG. 3, places (fixes) the shadow mask 81 above the vapor deposition source 85 in the vacuum chamber 60 with use of the mask holding member 87 via the mask tension mechanism 88, and horizontally holds the shadow mask 81 under tension by the mask tension mechanism 88 so that no bending or elongation due to the self weight is caused to the shadow mask 81. During this step, the method simultaneously (i) maintains the distance between the vapor deposition source 85 and the shadow mask 81 with use of the mask holding member 87 and (ii) carries out an alignment with use of the alignment markers 84 of the shadow mask 81 in such a manner that the substrate scanning direction is identical to the long-axis direction of the stripe-shaped openings 82 provided in the shadow mask 81. The above step assembles the mask unit 80 (preparation of a mask unit).

The method next inserts the TFT substrate 10 in the vacuum chamber 60 and, as indicated in FIG. 10, carries out a rough alignment with use of the alignment markers 221 of the TFT substrate 10 as the film formation substrate 200 so that each sub-pixel column of an identical color of the TFT substrate 10 has a direction that is identical to the substrate scanning direction (S11). The method holds the TFT substrate 10 with use of the substrate holding member 71 so that no bending due to the self weight is caused to the TFT substrate 10.

The method then adjusts the gap g1 (substrate-mask gap) between the TFT substrate 10 and the shadow mask 81 so that the gap is uniform, and places the TFT substrate 10 and the shadow mask 81 so that they face each other. This allows the TFT substrate 10 and the shadow mask 81 to be aligned with each other (S13). The present embodiment adjusted the gap g1 between the TFT substrate 10 and the shadow mask 81 to approximately 200 μm throughout the entire TFT substrate 10.

The method next carried out vapor deposition of materials for the red luminescent layer 23R with respect to the TFT substrate 10 while scanning the TFT substrate 10 at 30 mm/s.

The above step carried out a substrate scan in such a manner that the TFT substrate 10 passed through a position above the shadow mask 81. The above step simultaneously carried out the scan and a precise alignment with use of the alignment markers 84 and 221 so that the openings 82 of the shadow mask 81 coincide with red sub-pixel 2R columns (S14).

The luminescent layer 23R was made of (i) 3-phenyl-4(1'-naphthyl)-5-phenyl-1,2,4-triazole (TAZ) (host material) and (ii) bis(2-(2'-benzo[4,5-a]thienyl)pyridinato-N,C3')iridium (acetylacetonate) (btp2Ir(acac)) (red-light emitting dopant). These materials (red organic materials) were codeposited at respective vapor deposition rates of 5.0 nm/s and 0.53 nm/s to form the luminescent layer 23R.

Vapor deposition particles of the red organic materials which particles are emitted from vapor deposition source 85 are deposited, through the openings 82 of the shadow mask 81 and onto positions facing the respective openings 82 of the shadow mask 81, when the TFT substrate 10 passes through a position directly above the shadow mask 81. In the present embodiment, the TFT substrate 10 having passed through the position directly above the shadow mask 81 had the red organic materials deposited thereon at a film thickness of 25 nm.

This causes a vapor-deposited film having a striped shape to be formed on the TFT substrate 10 throughout a region from one end to the other end in a direction in which the TFT substrate 10 is moved (see FIG. 17).

The following describes, with reference to FIG. 11, a method for adjusting an alignment in S14 above.

FIG. 11 is a flowchart illustrating the alignment adjustment method. The alignment is adjusted as illustrated in the flow of FIG. 11.

The method first captures a substrate position of the TFT substrate 10 as the film formation substrate 200 with use of the image sensors 90 (S21).

Next, the image detecting section 101, on the basis of the image captured by the image sensors 90, detects respective images of (i) the alignment markers 221 of the TFT substrate 10 and of (ii) the alignment markers 221 of the shadow mask 81 (S22).

Then, the computing section 102 calculates, from the respective images of the alignment markers 221 and 84, the images having been detected by the image detecting section 101, the amount of positional difference between the alignment markers 221 and the alignment markers 84 to determine a correction value for a substrate position by computation (S23).

Next, the motor drive control section 103 drives the motor 72 on the basis of the correction value to correct the substrate position (S24).

Then, the image sensors 90 detect the substrate position as corrected, after which the steps S21 through S25 are repeated.

As described above, the present embodiment causes the image sensors 90 to repeatedly detect a substrate position to correct it. This makes it possible to simultaneously carry out a substrate scan and correct a substrate position, and consequently to form a film while carrying out a precise alignment between the TFT substrate 10 and the shadow mask 81.

The film thickness of the luminescent layer 23R can be adjusted on the basis of (i) a reciprocating scan (that is, reciprocating movement of the TFT substrate 10) and (ii) a scan rate. The present embodiment, after the scan in S14, (i) reversed the direction of scanning the TFT substrate 10, and (ii) further deposited the red organic materials by the same method as in S14 at the positions at which the red organic materials were deposited in S14. This formed a luminescent layer 23R having a film thickness of 50 nm.

The present embodiment, after the step S14, retrieved from the vacuum chamber 60 the TFT substrate 10 on which the luminescent layer 23R was formed (S15), and then formed a green luminescent layer 23G, with use of (i) a mask unit 80 for forming the green luminescent layer 23G and (ii) a vacuum chamber 60, in a manner similar to the above process of forming the luminescent layer 23R.

The present embodiment, after thus forming the luminescent layer 23G, formed a blue luminescent layer 23B, with use of (i) a mask unit 80 for forming the blue luminescent layer 23B and (ii) a vacuum chamber 60, in a manner similar to the respective processes of forming the luminescent layers 23R and 23G.

Specifically, the present embodiment, for each of the processes of forming the luminescent layers 23G and 23B, prepared a shadow mask 81 having openings 82 at positions for a corresponding one of the luminescent layers 23G and 23B. The present embodiment placed each shadow mask 81 in a vacuum chamber 60 for forming a corresponding one of the luminescent layers 23G and 23B, and thus scanned the TFT substrate 10 for vapor deposition while carrying out an alignment so that the openings 82 of the shadow mask 81 coincide with a corresponding one of (i) sub-pixel 2G columns and (ii) sub-pixel 2B columns.

The luminescent layer 23G was made of (TAZ) (host material) and Ir(ppy) 3 (green-light emitting dopant). These materials (green organic materials) were codeposited at respective vapor deposition rates of 5.0 nm/s and 0.67 nm/s to form the luminescent layer 23G.

The luminescent layer 23B was made of TAZ (host material) and 2-(4'-t-butyl phenyl)-5-(4"-biphenylyl)-1,3,4-oxadiazole (t-Bu PBD) (blue-light emitting dopant). These materials (blue organic materials) were codeposited at respective vapor deposition rates of 5.0 nm/s and 0.67 nm/s to form the luminescent layer 23B.

The luminescent layers 23G and 23B each had a film thickness of 50 nm.

The above steps prepared a TFT substrate 10 on which were formed respective patterns of the luminescent layers 23R, 23G, and 23B having respective colors of red (R), green (G), and blue (B).

By the way, in a case where vapor deposition layers (in the present embodiment, the luminescent layers 23R, 23G, and 23B of the organic EL elements 20) are formed by relative movement between the shadow mask 81 and the TFT substrate 10, the following problems can arise. FIG. 13 is a view schematically illustrating how the TFT substrate 10 is configured before formation of the luminescent layers 23R, 23G, and 23B.

As illustrated in FIG. 7, the TFT substrate 10 has the plurality of pixels that are arranged two-dimensionally (in the present embodiment, arranged in a matrix). In the following description, a region in which the plurality of pixels are arranged will be referred to as a pixel region $A_G$.

As mentioned above, the wires 14 run in a mesh-like manner in directions in which the plurality of pixels in the pixel region $A_G$ are aligned, and the wires 14 are drawn out of the pixel region $A_G$ so as to be electrically connected to an external circuit. The external circuit is, for example, a flexible film cable FC or an IC (Integrated circuit).

Terminals of the wires 14 that are drawn out of the pixel region $A_G$ are gathered in a plurality of regions outside the pixel region $A_G$. Such regions in which the terminals of the wires 14 are gathered will be hereinafter referred to as terminal section regions.

Specifically, a plurality of terminal section regions A1 through A4 are provided on an outside of and adjacently to sides L1 through L4 (on an outside of and along the sides L1 through L4) of a rectangle which the matrix forms so as to surround the pixel region $A_G$.

It is assumed here that (i) a terminal section region located on the left hand of the pixel region $A_G$ is the terminal section region A1, (ii) a terminal section region located on the right hand of the pixel region $A_G$ is the terminal section region A2, (iii) a terminal section region located on the upper hand of the pixel region $A_G$ is the terminal section region A3, and (iv) a terminal section region located on the lower hand of the pixel region $A_G$ is the terminal section region A4, as illustrated in FIG. 13.

Each of the terminals of the wires 14 (except for terminals connected to the second electrode 26) is located in a terminal section region adjacent to a side closest to the terminal out of the four sides L1 through L4 of the rectangle.

Assuming that the TFT substrate 10 is moved in the left-right direction of FIG. 13, the terminal section regions A1 and A2, which are close to the sides L1 and L2 that are vertical to the direction in which the TFT substrate 10 is moved, are referred to as vertical-side terminal section regions A1 and A2, whereas the terminal section regions A3 and A4, which are close to the sides that are parallel to the direction in which the TFT substrate 10 is moved, are referred to as parallel-side terminal section regions A3 and A4.

Meanwhile, connection sections to be connected to the second electrode 26 are provided in regions different from the terminal section regions A1 through A4. In the present embodiment, such connection sections to be connected to the second electrode 26 are provided on an outside of and adjacently to the upper and lower sides of the rectangle. Regions where such connection sections to be connected to the second electrode 26 are provided will be hereinafter referred to as second electrode connection sections. As illustrated in FIG. 13, an upper second electrode connection section will be hereinafter referred to as a second electrode connection section A5, whereas a lower second electrode connection section will be hereinafter referred to as a second electrode connection section A6.

In FIG. 13, the pixel region $A_G$ and the second electrode connection sections A5 and A6 are sealed by the sealing substrate 40, whereas the terminal section regions A1 through A4 are exposed to an outside without being sealed.

FIG. 14 is a view illustrating a state where the TFT substrate 10 sealed by the sealing substrate 40 is about to be connected to the flexible film cable FC which is one example of the external circuit. FIG. 15 is a view illustrating a region around the terminals of the wires 14 located in the vertical-side terminal section region A1.

Each of the terminals of the wires 14 whose terminals are gathered in the vertical-side terminal section region A1 is connected, in a connection region 202, to a connection terminal $FC_T$ of the flexible film cable FC via an anisotropically-conductive adhesive film (ACF) or the like, for example, as illustrated in FIG. 15. The same is true for the terminals of the wires 14 whose terminals are gathered in the vertical-side terminal section region A2 and for the terminals of the wires 14 whose terminals are gathered in the parallel-side terminal section regions A3 and A4.

It is assumed here that, through relative movement between the shadow mask 81 and the TFT substrate 10, an organic film (e.g., the luminescent layer 23R) is vapor-deposited on the TFT substrate 10, which has the terminal section regions A1 through A4 exposed to an outside, throughout a region from one end to the other end in a direction of the movement.

A vapor deposition region can be caused to substantially coincide with the pixel region $A_G$ by appropriately setting a range of the openings 82 in a direction vertical to the direction of the movement. This makes it possible to prevent the organic film from being vapor-deposited on the parallel-side terminal section regions A3 and A4.

Meanwhile, the organic film is vapor-deposited on the vertical-side terminal section regions A1 and A2, so that the connection regions 202 of the terminals located in the vertical-side terminal section regions A1 and A2 are covered with the organic film as illustrated in FIG. 15. As described above, the organic film formed with the use of the shadow mask 81 is a pattern film having a striped shape. Assuming that each stripe of this pattern film is referred to as a vapor-deposited section Q, the connection regions 202 of the terminals located in the vertical-side terminal section regions A1 and A2 are covered with the vapor-deposited sections Q depending on a positional relationship between the vapor-deposited sections Q and the wires 14.

In a case where the organic film has high electrical resistance, there arises a problem that good electrical connection between (i) the wires 14 having respective terminals in the vertical-side terminal section regions A1 and A2 and (ii) the connection terminal $FC_T$ of the flexible film cable FC cannot be established. Failure to establish good electrical connection with the connection terminal $FC_T$ of the flexible film cable FC results in that the flexible film cable FC peels off from the TFT substrate 10 or in that the organic EL display device 1 has a display failure.

Meanwhile, in a case where the organic film has low electrical resistance, there arises a problem that an electrical leakage occurs via the organic film.

It is therefore necessary to take measures for preventing the organic film from being vapor-deposited and formed on the terminals located in the vertical-side terminal section regions A1 and A2. Such regions where the organic film should not be vapor-deposited will be hereinafter referred to as vapor deposition unnecessary regions.

One of the measures is to prevent vapor deposition on the vapor deposition unnecessary regions by blocking vapor deposition of the organic film with the use of a shutter 89, specifically, to close the shutter 89 when the vapor deposition unnecessary regions reach the openings 82 of the shadow mask 81.

However, this causes a difference among parts of the TFT substrate 10 in terms of period of time for which the parts face the openings 82 since each of the openings 82 has a length in the direction of the movement. This may leave a region, above the openings 82 of the shadow mask 81, in which the organic film should be vapor-deposited but has not been vapor-deposited when the shutter 89 is closed. Closing the shutter 82 in such a state causes shortage of a vapor deposition amount in the region in which the organic film should be vapor-deposited. This leads to a problem that an appropriate thickness of the vapor-deposited film cannot be secured in the region.

Another one of the measures is to wipe away the organic film with the use of an organic solvent in a later step. However, this causes problems such as occurrence of a residue of the organic solvent and introduction of dust.

In view of the above problems, the TFT substrate 10 of the present embodiment is arranged such that the terminals (except the terminals connected to the second electrode 26) of the wires 14 are provided not to be located in parts (hereinafter referred to as "vapor-deposited sections") on which the vapor-deposited film is to be vapor-deposited.

FIG. 16 is a view illustrating how the plurality of wires 14 are disposed on the TFT substrate 10. FIG. 17 is an enlarged view illustrating a structure around the terminals of the wires 14 illustrated in FIG. 16. Note that the wires 14 are referred to as wires L in FIGS. 16 and 17.

In the present embodiment, the openings 82 formed in the shadow mask 81 (FIG. 2) are aligned in a direction perpendicular to a direction of the relative movement between the shadow mask 81 and the TFT substrate 10. Accordingly, the vapor-deposited sections Q each have a linear shape extending in a direction corresponding to the direction of the relative movement (the left-right direction of FIG. 16). As such, the vapor-deposited sections Q have a striped shape as a whole.

In the present embodiment, the terminals of the wires L whose terminals are located in the vertical-side terminal section regions A1 and A2 are located in gaps X each having a linear shape and being formed between corresponding two adjacent vapor-deposited sections Q (see FIGS. 16 and 17).

Note that the present embodiment employs an arrangement in which (i) the second electrode connection section A5 is provided between the parallel-side terminal section region A3 and the side of the rectangle in the vicinity of the parallel-side terminal section region A3 and (ii) the second electrode connection section A6 is provided between the parallel-side terminal section region A4 and the side of the rectangle in the vicinity of the parallel-side terminal section region A4. Note, however, that the second electrode connection sections A5 and A6 are not limited to these locations.

With the arrangement, it is possible to prevent the organic film from being vapor-deposited on the terminals of the wires L located in the vertical-side terminal section regions A1 and A2. As a result, electrical connection can be well established between the terminals of the wires L (the gate lines 14G) and the connection terminal $FC_T$ of the flexible film cable FC.

Further, the arrangement eliminates the need for the conventional measure of wiping away the organic film formed in the vertical-side terminal section regions A1 and A2 with the use of an organic solvent in a later step. This allows a reduction in time and cost for production.

Moreover, it is possible to prevent the problems, which conventionally occur due to wiping of the vapor-deposited film with the use of an organic solvent, such as (i) occurrence of a residue due to insufficient wiping and (ii) occurrence of a foreign substance which causes connection failure with an external circuit and ultimately causes a reduction in yield of an organic EL display device. In addition, it is possible to prevent the organic solvent from damaging the sealing substrate 40 and the like, thereby preventing a reduction in reliability of the organic EL display device 1.

Moreover, there is no need for addition of any step and device since it is only necessary to change design of the wires on the TFT substrate 10.

In the present embodiment, the terminals of the wires L located in the vertical-side terminal section regions A1 and A2 are disposed in the gaps X each having a linear shape and being formed between corresponding adjacent two vapor-deposited sections Q. In addition, a gap X is provided for each wire L (provided corresponding to each wire L), and each wire L drawn out of the pixel region $A_G$ extends in a gap X corresponding to the wire L.

In each of the gaps X, a plurality of terminals T are provided so as to be aligned in a direction in which the gap X extends (the left-right direction in FIGS. 16 and 17).

Some of the wires L extend from the pixel region $A_G$ to their respective terminals T by passing across the vapor-deposited sections Q. In the present embodiment, such wires L passing across the vapor-deposited sections Q are wires L other than wires L located in a central part in the up-down direction of FIG. 16. Note, however, that the present embodiment is not limited to this. Although the present embodiment deals with a case where some of the wires L extend from the pixel region $A_G$ to their respective terminals T by passing across the vapor-deposited sections Q, the number of such wires is not limited. Alternatively, it is also possible to employ such wire design that all of the wires 14 extend from the pixel region $A_G$ to their respective terminals T by passing across the vapor-deposited sections Q.

As illustrated in FIG. 17, a terminal T1 of a wire $L_{P1}$ which is an uppermost wire L drawn out from the pixel region $A_G$ and a terminal T2 of a wire $L_{P2}$ next to the wire $L_{P1}$ are located in an identical gap $X_P$ and aligned in a direction in which the gap $X_P$ extends.

The wires $L_{P1}$ and $L_{P2}$ are drawn out from the pixel region $A_G$ to respective gaps X1 and X2 respectively corresponding to the wires $L_{P1}$ and $L_{P2}$, and are bent halfway. The wire $L_{P1}$ passes across (diagonally crosses) vapor-deposited sections Q1 through Q5 until it reaches the terminal T1 disposed in the gap $X_P$, whereas the wire $L_{P2}$ passes across (diagonally crosses) the vapor-deposited sections Q2 through Q5 until it reaches the terminal T1 disposed in the gap $X_P$.

Since a plurality of terminals T are provided in a common gap X and are aligned in a direction in which the gap X extends (the left-right direction in FIGS. 16 and 17), a length H of the vertical-side terminal section regions A1 and A2 in a direction perpendicular to the direction of the relative movement between the TFT substrate 10 and the shadow mask 81 can be shortened as compared with a case where a single terminal T is provided in each gap X. As a result, it is possible to shorten a length, in the corresponding direction, of members such as the flexible film cable FC that is connected to the terminals T located in the vertical-side terminal section regions A1 and A2.

The present embodiment is effective especially in a case where a width of each of the gaps X is not enough for a plurality of wires 14 to be provided (in a case where a width of each of the gaps X allows only one wire 14 to be provided).

The film formation substrate of the present invention is not limited to the present embodiment, but can be modified as follows.

Second Embodiment

Next, Second Embodiment of the present invention will be described below. The present embodiment mainly deals with differences from First Embodiment. Members that have identical functions to those of First Embodiment are given identical reference numerals, and are not explained repeatedly.

FIG. 18 is a view illustrating how a plurality of wires 14 are disposed on a TFT substrate 10 in Second Embodiment. FIG. 19 is an enlarged view of a structure around terminals of the wires 14 illustrated in FIG. 18. Note that the wires 14 are referred to as wires L in FIGS. 18 and 19.

The TFT substrate 10 of the present embodiment is different from that of First Embodiment in how the wires are disposed.

Specifically, the present embodiment employs an arrangement in which (i) the wires L drawn out from a pixel region $A_G$ are divided into groups each of which includes a plurality of wires L (the number of wires L in each group is predetermined; two in FIGS. 18 and 19) and (ii) the groups are associated with respective gaps X. In each of the gaps X, a plurality of wires 14 belonging to a group associated with the gap X are provided so as to extend in a direction parallel to a direction in which the gap X extends.

Meanwhile, as in First Embodiment, a plurality of terminals T are disposed in each of the gaps X and are aligned in a direction in which the gap X extends (the left-right direction in FIGS. 18 and 19). This is similar to First Embodiment.

In the present embodiment, out of the wires L having respective terminals T in each gap X, a first wire L whose terminal T is farther from the pixel region $A_G$ than a terminal T of a second wire L is provided so as to avoid the terminal T of the second wire L by overlapping a vapor-deposited section Q in the vicinity of the terminal T of the second wire L.

For example, it is assumed that a terminal T1' of a wire $L_{P1}$' which is an uppermost wire L drawn out from the pixel region $A_G$ and a terminal $T2'$ of a wire $L_{P2}'$ next to the wire $L_{P1}'$ belong to an identical group and are disposed in an identical gap $X_P'$ (see FIG. 19). In this case, the terminals $T1'$ and $T2'$ are aligned in a direction in which the gap $X_P'$ extends.

The wires $L_{P1}'$ and $L_{P2}'$ are drawn out from the pixel region $A_G$ to the common gap $X_P'$ corresponding to the wires $L_{P1}'$ and $L_{P2}'$ and extend in the gap $X_P'$. The terminal $T1'$ of the wire $L_{P1}'$ is provided farther from the pixel region $A_G$ than the terminal $T2'$ of the wire $L_{P2}'$.

The wire $L_{P2}'$ extends in a straight line to the terminal $T2'$ (while preserving a linear shape). Meanwhile, the wire $L_{P1}'$ has, only in the vicinity of the terminal $T2'$, a bypass (see the arrow W) for avoiding the terminal $T2'$ by overlapping a vapor-deposited section Q.

Since a plurality of terminals T are provided in a common gap X and are aligned in a direction in which the gap X extends (the left-right direction in FIGS. 18 and 19), a length H of the vertical-side terminal section regions A1 and A2 in a direction perpendicular to the direction of the relative movement between the TFT substrate 10 and the shadow mask 81 can be shortened. As a result, it is possible to shorten a length, in the corresponding direction, of members such as the flexible film cable FC that is connected to the terminals located in the vertical-side terminal section regions A1 and A2.

The present embodiment is effective especially in a case where the number of gaps X is smaller than the number of wires 14 (terminals T) but each of the gaps X has an enough width for a plurality of wires 14 to be provided.

The present invention is not limited to the description of the embodiments above, but may be altered by a skilled person within the scope of the claims. An embodiment based on a proper combination of technical means disclosed in different embodiments is encompassed in the technical scope of the present invention.

For the purpose of, for example, causing an organic film to have different thicknesses for respective colors, an organic layer (e.g., a hole transfer layer) other than luminescent layers can be formed by the selective vapor deposition using the shadow mask. In this case, the TFT substrate 10 obtained immediately before formation of the hole transfer layer is an example of the film formation substrate of the present invention.

The vapor deposition device 50 may include, instead of the substrate moving mechanism 70, (i) a substrate holding member 71 (for example, an electrostatic chuck) for fixing the film formation substrate 200 and (ii) a mask unit moving mechanism for moving the mask unit 80 relative to the film formation substrate 200 while maintaining the respective positions of the shadow mask 81 and the vapor deposition source 85 relative to each other. The vapor deposition device 50 may alternatively include both the substrate moving mechanism 70 and the mask unit moving mechanism.

In other words, the film formation substrate 200 and the mask unit 80 simply need to be so provided that at least one of them is moveable relative to the other. The advantages of the present invention can be achieved regardless of which of the film formation substrate 200 and the mask unit 80 is arranged to move.

In the case where the film formation substrate 200 is moved relative to the mask unit 80 as described above, the shadow mask 81 and the vapor deposition source 85 simply need to be fixed in position relative to each other, but do not necessarily need to be integrated with each other.

The mask unit 80 may be arranged, for example, such that (i) the vapor deposition source 85 is fixed to, for example, a bottom wall among inner walls of the vacuum chamber 60, (ii) the mask holding member 87 is fixed to one of the inner walls of the vacuum chamber 60, and consequently (iii) the shadow mask 81 and the vapor deposition source 85 are fixed in position relative to each other.

The present embodiment describes an example case in which the openings 82 of the shadow mask 81 are aligned with the injection holes 86 of the vapor deposition source 85 so that the injection holes 86 are each positioned inside one of the openings 82 in a plan view and that the openings 82 are provided in a one-to-one correspondence with the injection holes 86. The present embodiment is, however, not limited to such an arrangement. The openings 82 do not necessarily need to be provided (i) to face the injection holes 86 or (ii) in a one-to-one correspondence with the injection holes 86.

The present embodiment describes an example case in which both (i) the openings 82 of the shadow mask 81 and (ii) the injection holes 86 of the vapor deposition source 85 are arranged one-dimensionally. The present embodiment is, however, not limited to such an arrangement. It is only necessary that the openings 82 of the shadow mask 81 face the injection holes 86 of the vapor deposition source 85, and it is alternatively possible to arrange both the openings 82 of the shadow mask 81 and the injection holes 86 of the vapor deposition source 85 two-dimensionally.

The present embodiment describes an example case involving a plurality of openings 82 in the shadow mask 81 and a plurality of injection holes 86 in the vapor deposition source 85. The present embodiment is, however, not limited to such an arrangement. The shadow mask 81 is simply required to include at least one opening 82, whereas the vapor deposition source 85 is simply required to include at least one injection hole 86.

In other words, the present embodiment may alternatively be arranged such that the shadow mask 81 includes only one opening 82 and that the vapor deposition source 85 includes only one injection hole 86. Even this arrangement makes it possible to form a predetermined pattern on the film formation substrate 200 by (i) moving at least one of the mask unit 80 and the film formation substrate 200 relative to the other and (ii) sequentially depositing vapor deposition particles onto the vapor deposition region 210 of the film formation substrate 200 through the openings 82 of the shadow mask 81.

Although the present embodiment does not mention a mechanism for restricting spread of vapor deposition flow, a restriction plate that is capable of restricting spread of vapor deposition flow injected from the injection holes 86 to a certain amount may be, for example, provided between the vapor deposition source 85 and the shadow mask 81. The arrangement makes it possible to restrict an incident angle of the vapor deposition particles deposited onto the vapor deposition region 210 of the film formation substrate 200 through the opening 82, and consequently, to restrict blurring of a pattern on the film formation substrate. Such restriction of blurring allows the gaps X to be wider.

The present embodiment describes an example case in which the shadow mask 81 includes slit-shaped openings 82. The shape of the openings 82 can, however, be simply set as appropriate to form a desired vapor deposition pattern, and is thus not particularly limited to any specific one.

The present embodiment describes an example method for producing, as described above, an organic EL display device 1 of the bottom emission type, which extracts light from the TFT substrate 10 side. The present embodiment is, however, not limited to such production. The present invention is also suitably applicable to an organic EL display device 1 of a top emission type, which extracts light from the sealing substrate 40 side.

The present embodiment describes an example case that uses a glass substrate as a supporting substrate for each of the TFT substrate 10 and the sealing substrate 40. The present embodiment is, however, not limited to such an arrangement.

The respective supporting substrates for the TFT substrate 10 and the sealing substrate 40 may, for example, each be, other than a glass substrate, a transparent substrate such as a plastic substrate in the case where the organic EL display device 1 is an organic EL display device of the bottom emission type. In the case where the organic EL display device 1 is an organic EL display device of the top emission type, the respective supporting substrates may, for example, each be an opaque substrate such as a ceramics substrate other than the above transparent substrate.

The present embodiment describes an example case involving an anode (in the present embodiment, the first electrode 21) formed in a matrix. The anode is, however, not particularly limited in terms of shape, material, or size as long as it has the function as an electrode for supplying positive holes to an organic EL layer. The anode may have, for example, a stripe shape. By the nature of an organic EL element, at least one of the anode and the cathode is preferably transparent. An organic EL element typically includes a transparent anode.

The present embodiment describes an example method for producing an active matrix organic EL display device which has a TFT in each pixel. The present embodiment is, however, not limited to such production. The present invention is also suitably applicable to a passive matrix organic EL display device 1 which has no TFT in each pixel.

In the present embodiment, the scan rate, the vapor deposition rate, and the like can be set as appropriate.

The gap g1 between the TFT substrate 10 serving as the film formation substrate 200 and the shadow mask 81 and the gap g2 between the vapor deposition source 85 and the shadow mask 81 can be set as appropriate.

The gap g1 between the TFT substrate 10 and the shadow mask 81 may be adjusted as appropriate as long as (i) the gap is fixed and (ii) the TFT substrate 10 and the shadow mask 81 do not come into contact with each other. The gap g2 between the vapor deposition source 85 and the shadow mask 81 may be adjusted as appropriate in consideration of (i) distribution of, for example, spatial spread of vapor deposition particles and (ii) influence of heat radiated from the vapor deposition source 85.

The present invention is applicable not only to production of the organic EL display device 1, but also to production of other devices which face a problem of formation of a vapor-deposited film on a terminal section region in a case where vapor deposition is carried out by relative movement of a substrate and a shadow mask.

[Overview]

As described above, the film formation substrate of an embodiment of the present invention may be arranged such that the plurality of openings are aligned in a direction perpendicular to the direction in which the film formation substrate is moved, the vapor-deposited sections each have a linear shape extending in a direction corresponding to the direction in which the film formation substrate is moved, and the terminals are disposed in the gaps each having a linear shape.

The film formation substrate of an embodiment of the present invention is arranged such that in each of the gaps in which the terminals are disposed, a plurality of terminals of respective corresponding ones of the plurality of wires are disposed.

The arrangement, in which in each of the gaps in which the terminals are disposed, a plurality of terminals of respective corresponding ones of the plurality of wires are disposed, makes it possible to prevent vapor deposition on the terminals even in a case where the number of wires (terminals) is larger than the number of gaps.

The film formation substrate of an embodiment of the present invention may be arranged such that the plurality of terminals provided in the each of the gaps are aligned in a direction in which the gaps extend, and at least some of the wires extend from the pixel region to their respective terminals by passing across the vapor-deposited sections. This arrangement is effective especially in a case where each of the gaps does not have a width corresponding to a plurality of wires.

The film formation substrate of an embodiment of the present invention may be arranged such that the plurality of terminals disposed in the each of the gaps are aligned in a direction in which the gaps extend, a plurality of wires are provided in parallel to each other in the each of the gaps, and out of the plurality of wires provided in the each of the gaps, a first wire whose terminal is farther from the pixel region than that of a second wire has a bypass which passes around the terminal of the second wire, at least part of the bypass overlapping one of the vapor-deposited sections. This arrangement is effective especially in a case where the number of gaps is smaller than the number of wires (terminals), but each of the gaps has a width enough for a plurality of wires to be provided.

An organic EL display device of an embodiment of the present invention includes any of the above film formation substrates on which vapor-deposited sections have been formed, the vapor-deposited sections each including an organic EL element which emits light in response to an electric current.

The arrangement makes it possible to provide an organic EL display device that is capable of achieving the effect brought about by any of the above film formation substrates.

INDUSTRIAL APPLICABILITY

The film formation substrate of the present invention is suitably applicable, for example, to a device and a method for producing an organic EL display device, which device and method are employed for a film formation process such as selective formation of organic layers of an organic EL display device.

REFERENCE SIGNS LIST

1: Organic EL display device
2: Pixel
10: TFT substrate (film formation substrate)
26: Second electrode
50: Vapor deposition device
81: Shadow mask (vapor deposition mask)
82: Opening
85: Vapor deposition source
86: Injection hole
200: Film formation substrate
210: Vapor deposition region
211: Vapor-deposited film (vapor-deposited section)
14: Wire
AG: Pixel region

The invention claimed is:

1. A film formation substrate on which vapor-deposited sections are formed by use of a vapor deposition device which includes (i) a vapor deposition source having injection holes from which vapor deposition particles are injected and (ii) a vapor deposition mask facing the vapor deposition source and having a plurality of openings through which the vapor deposition particles injected from the injection holes are deposited so as to form the vapor-deposited sections, the film formation substrate comprising:

a plurality of pixels two-dimensionally arranged in a pixel region; and a plurality of wires electrically connected to the respective plurality of pixels, the vapor-deposited sections being formed with gaps therebetween in a region including the pixel region by injecting the vapor deposition particles from the injection holes while moving the film formation substrate relative to the vapor deposition mask in a direction so that the pixel region passes a region facing the plurality of openings, the plurality of openings being aligned in a direction perpendicular to the direction in which the film formation substrate is moved, the vapor-deposited sections each having a linear shape extending in a direction corresponding to the direction in which the film formation substrate is moved, the plurality of wires having respective terminals that are disposed in the gaps each having a linear shape, in each of the gaps in which the terminals are disposed, a plurality of terminals of respective corresponding ones of the plurality of wires are disposed, the plurality of terminals disposed in said each of the gaps being aligned in a direction in which the gaps extend, and at least some of the plurality of wires extending from the pixel region to their respective terminals by passing across the vapor-deposited sections.

2. A film formation substrate on which vapor-deposited sections are formed by use of a vapor deposition device which includes (i) a vapor deposition source having injection holes from which vapor deposition particles are injected and (ii) a vapor deposition mask facing the vapor deposition source and having a plurality of openings through which the vapor deposition particles injected from the injection holes are deposited so as to form the vapor-deposited sections, the film formation substrate comprising:

a plurality of pixels two-dimensionally arranged in a pixel region; and a plurality of wires electrically connected to the respective plurality of pixels, the vapor-deposited sections being formed with gaps therebetween in a region including the pixel region by injecting the vapor deposition particles from the injection holes while moving the film formation substrate relative to the vapor deposition mask in a direction so that the pixel region passes a region facing the plurality of openings, the plurality of openings being aligned in a direction perpendicular to the direction in which the film formation substrate is moved, the vapor-deposited sections each having a linear shape extending in a direction corresponding to the direction in which the film formation substrate is moved, the plurality of wires having respective terminals that are disposed in the gaps each having a linear shape, in each of the gaps in which the terminals are disposed, a plurality of terminals of respective corresponding ones of the plurality of wires are disposed, the plurality of terminals disposed in said each of the gaps being aligned in a direction in which the gaps extend, the corresponding ones of the plurality of wires being provided in parallel with each other in said each of the gaps, and out of the plurality of wires provided in said each of the gaps, a first wire whose terminal is farther from the pixel region than a terminal of a second wire having a bypass for avoiding the terminal of the second wire, at least part of the bypass overlapping one of the vapor-deposited sections.

3. An organic EL display device comprising a film formation substrate as set forth in claim 1 on which the vapor-deposited sections have been formed, the vapor-deposited sections each including an organic EL element which emits light in response to an electric current.

4. An organic EL display device comprising a film formation substrate as set forth in claim 2 on which the vapor-deposited sections have been formed, the vapor-deposited sections each including an organic EL element which emits light in response to an electric current.

* * * * *